United States Patent
Singh et al.

(10) Patent No.: US 11,855,170 B2
(45) Date of Patent: *Dec. 26, 2023

(54) MOSFET DEVICE STRUCTURE WITH AIR-GAPS IN SPACER AND METHODS FOR FORMING THE SAME

(71) Applicant: Taiwan Semiconductor Manufacturing Company Limited, Hsinchu (TW)

(72) Inventors: Gulbagh Singh, Tainan (TW); Po-Jen Wang, Taichung (TW); Kun-Tsang Chuang, Miaoli (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/741,609

(22) Filed: May 11, 2022

(65) Prior Publication Data

US 2022/0271141 A1 Aug. 25, 2022

Related U.S. Application Data

(63) Continuation of application No. 16/835,556, filed on Mar. 31, 2020, now Pat. No. 11,367,778.

(51) Int. Cl.
*H01L 29/49* (2006.01)
*H01L 21/28* (2006.01)
(Continued)

(52) U.S. Cl.
CPC .... *H01L 29/4991* (2013.01); *H01L 21/28141* (2013.01); *H01L 21/31116* (2013.01);
(Continued)

(58) Field of Classification Search
CPC ......... H01L 21/28141; H01L 21/76264; H01L 21/76289; H01L 21/764; H01L 21/7682;
(Continued)

(56) References Cited

U.S. PATENT DOCUMENTS 5,783,475 A * 7/1998 Ramaswami ....... H01L 29/6659
438/303
6,127,711 A 10/2000 Ono
(Continued)

FOREIGN PATENT DOCUMENTS

KR 20010011638 A 2/2001
KR 20050018398 A 2/2005
(Continued)

OTHER PUBLICATIONS

German Patent and Trademark Office, Application No. 102020110267.4, Office Action dated Oct. 31, 2020, 7 pages.
(Continued)

*Primary Examiner* — David C Spalla
(74) *Attorney, Agent, or Firm* — The Marbury Law Group, PLLC

(57) ABSTRACT

A transistor device and method of making the same are disclosed. The transistor device includes one or more air gaps in one or more sidewall spacers. The one or more air gaps may be located adjacent the gate and/or above the source or drain regions of the device. Various embodiments may include different combinations of air gaps formed in one or both sidewall spacers. Various embodiments may include air gaps formed in one or both sidewall spacers adjacent to the gate and/or above the source or drain regions of the device. The formation of the air gaps may reduce unwanted parasitic and/or fringing capacitance.

20 Claims, 22 Drawing Sheets

(51) Int. Cl.
*H01L 21/311* (2006.01)
*H01L 29/66* (2006.01)
*H01L 29/417* (2006.01)
*H10B 10/00* (2023.01)
*H10B 12/00* (2023.01)

(52) U.S. Cl.
CPC .... *H01L 29/41775* (2013.01); *H01L 29/6653* (2013.01); *H01L 29/6656* (2013.01); *H10B 10/00* (2023.02); *H10B 12/00* (2023.02)

(58) Field of Classification Search
CPC ............. H01L 29/0649; H01L 29/0653; H01L 29/4991; H01L 29/6653; H01L 29/66553; H01L 29/6656; H01L 2221/1042; H01L 2221/1047
See application file for complete search history.

(56) References Cited

U.S. PATENT DOCUMENTS

| | | |
|---|---|---|
| 6,190,996 B1 | 2/2001 | Mouli et al. |
| 6,495,900 B1 | 6/2002 | Mouli et al. |
| 11,367,778 B2 * | 6/2022 | Singh .................... H01L 29/665 |
| 2005/0037585 A1 * | 2/2005 | Park .................... H01L 29/6656 |
| | | 438/303 |
| 2007/0196972 A1 | 8/2007 | Shima |
| 2015/0263122 A1 | 9/2015 | Hsiao et al. |

FOREIGN PATENT DOCUMENTS

| | | |
|---|---|---|
| TW | 201535488 A | 9/2015 |
| TW | 202011517 A | 3/2020 |

OTHER PUBLICATIONS

TW Patent and Trademark Office, TW Application No. 11021040030, Office Action dated Oct. 26, 2021, 9 pages.
Taiwan Patent and Trademark Office, Application No. 109130998, Office Action dated Jul. 12, 2021, 7 pages.
Korean Patent and Trademark Office, KR Application No. 1020200083346, Office Action dated Jul. 22, 2021, 7 pages.
Korean Patent and Trademark Office, Application No. 10-2022-0084774, Notice of Allowance of Patent dated Oct. 21, 2022, 8 pages.

* cited by examiner

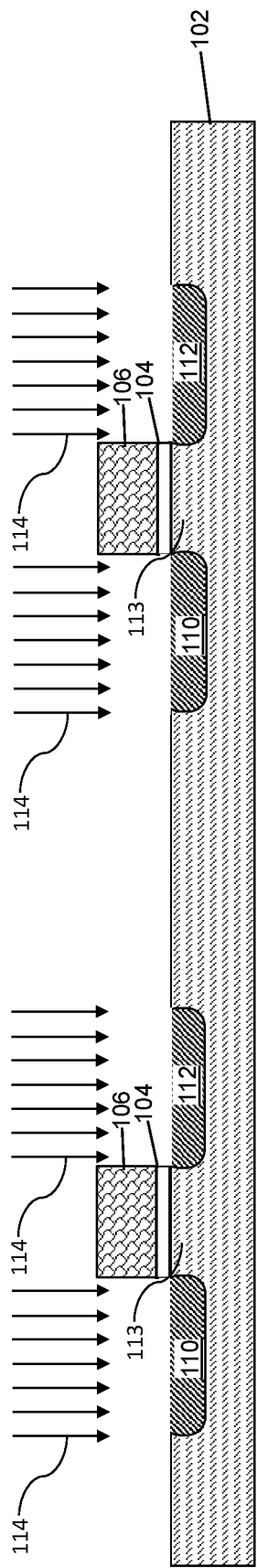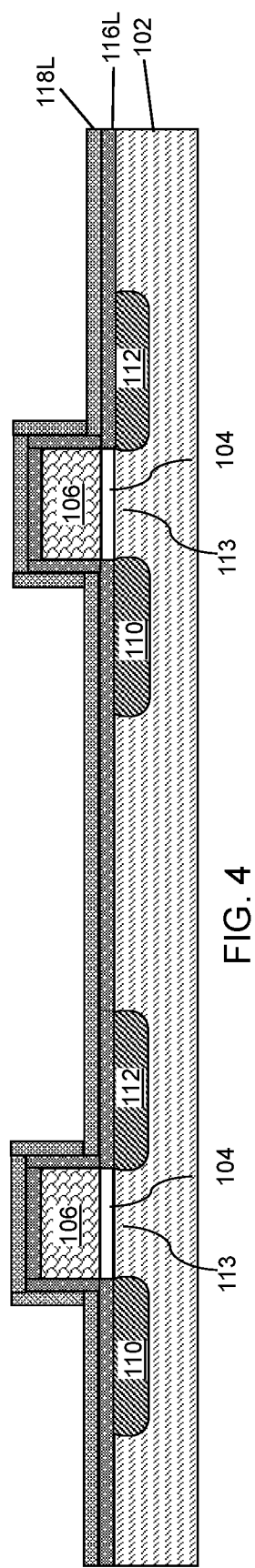

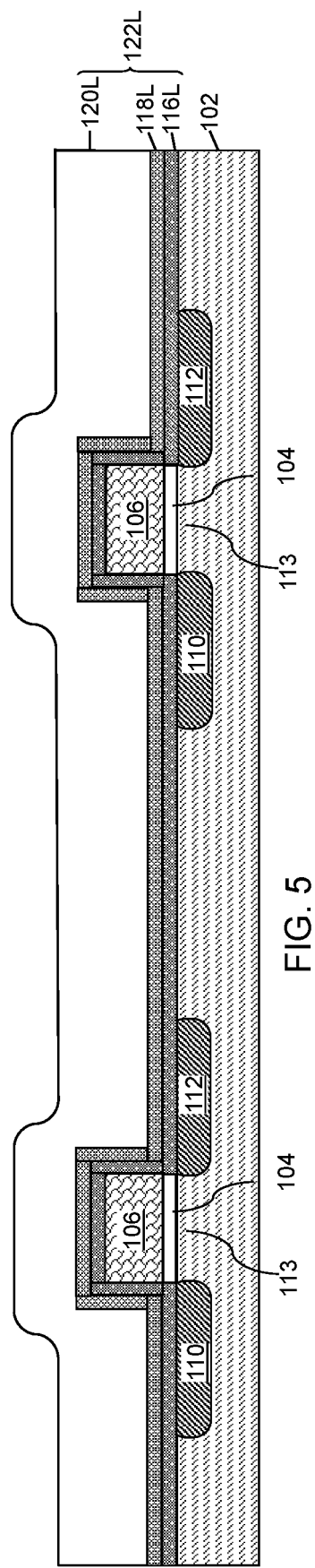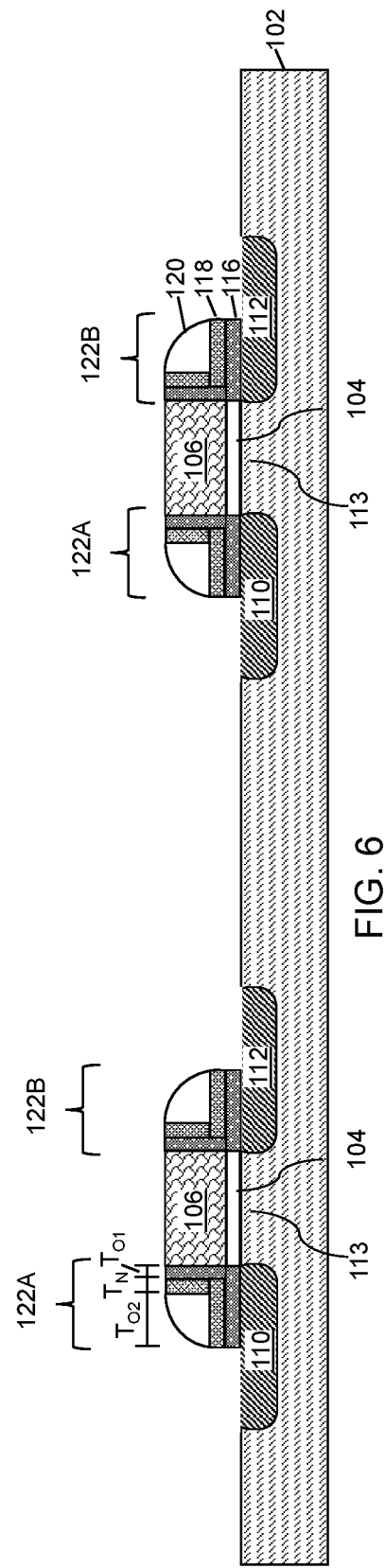
FIG. 5
FIG. 6

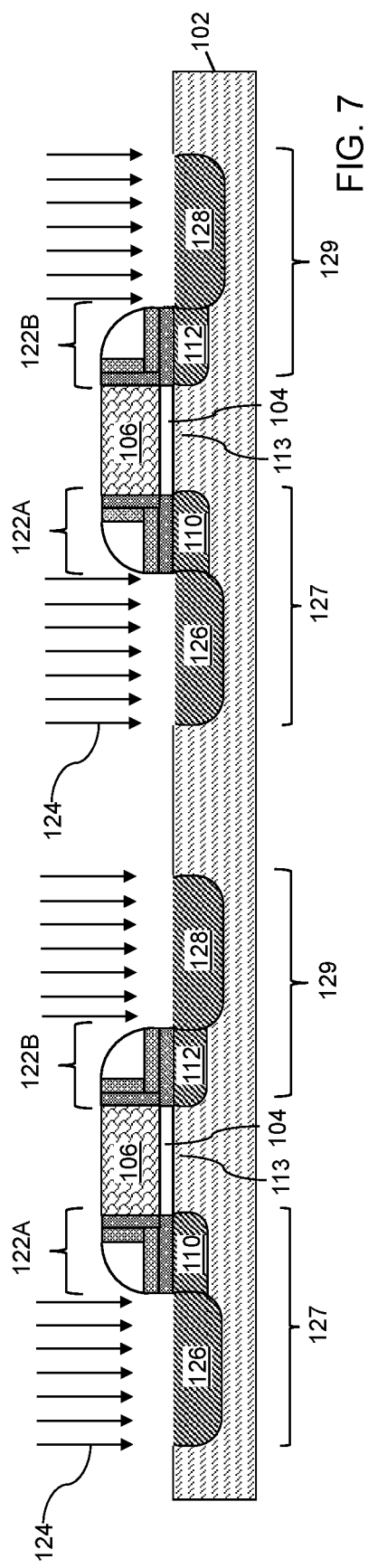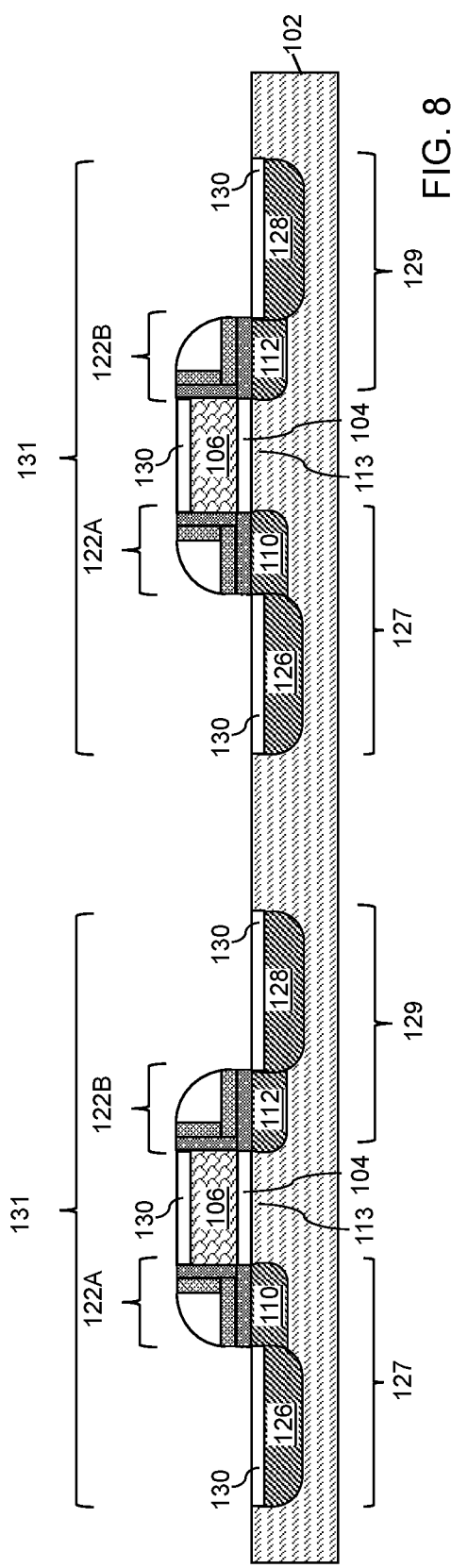

MOSFET DEVICE STRUCTURE WITH AIR-GAPS IN SPACER AND METHODS FOR FORMING THE SAME

RELATED APPLICATION

The instant application is a continuation application of U.S. application Ser. No. 16/835,556 entitled "MOSFET Device Structure with Air-Gaps in Spacer and Methods for Forming the Same," filed on, Mar. 31, 2020, the entire contents of which are incorporated herein by reference for all purposes.

BACKGROUND

Parasitic/overlap capacitances resulting from capacitive effects across sidewall spacers and/or from the gate oxide dielectric layer degrade the performance of metal-oxide semiconductor field effect transistor (MOSFET) devices, especially for MOSFET devices that operate in radio frequency (RF). In particular, the magnitude of the parasitic/overlap capacitances may significantly impact the switching speed of the MOSFET device. The larger the capacitance, the more charge must be drained in order for the MOSFET device to switch. Thus, the switching speed is significantly slowed.

Parasitic capacitances may include various junction and overlap capacitances. Junction capacitances depend on the depth of the junctions. Overlap capacitances depend on the amount of overlap between the implanted regions (i.e. source and drain regions) and the gate. In addition to the junction and overlap capacitances, inner fringing capacitances resulting from the interaction of charge out of the side of the gate with the source and drain regions and outer fringing capacitances resulting from the interaction of charge out from the bottom of the gate to the source and drain regions may be present which also adversely affect the performance of MOSFET devices. Further, the use of high-k gate and spacer materials may increase the magnitude of fringing fields, resulting in higher fringing capacitance which may compromise short-channel performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a vertical cross-sectional view illustrating a step of ion implanting to form source and drain extension regions in the substrate in a method for fabricating a semiconductor device in accordance with some embodiments.

FIG. 4 is a vertical cross-sectional view illustrating a step of forming continuous a first oxide layer and a continuous nitride layer in a method for fabricating a semiconductor device in accordance with some embodiments.

FIG. 5 is a vertical cross-sectional view illustrating a step of forming a continuous second oxide layer in over the continuous nitride layer a method for fabricating a semiconductor device in accordance with some embodiments.

FIG. 6 is a vertical cross-sectional view illustrating a step of etching the continuous first oxide layer, the nitride layer and the second oxide layer to form sidewall spacers in a method for fabricating a semiconductor device in accordance with some embodiments.

FIG. 7 is a vertical cross-sectional view illustrating a step of ion implanting to form deep source and drain regions in the substrate in a method for fabricating a semiconductor device in accordance with some embodiments.

FIG. 8 is a vertical cross-sectional view illustrating a step of siliciding the deep source and drain regions and the gate in a method for fabricating a semiconductor device in accordance with some embodiments.

DETAILED DESCRIPTION

Figure 1:
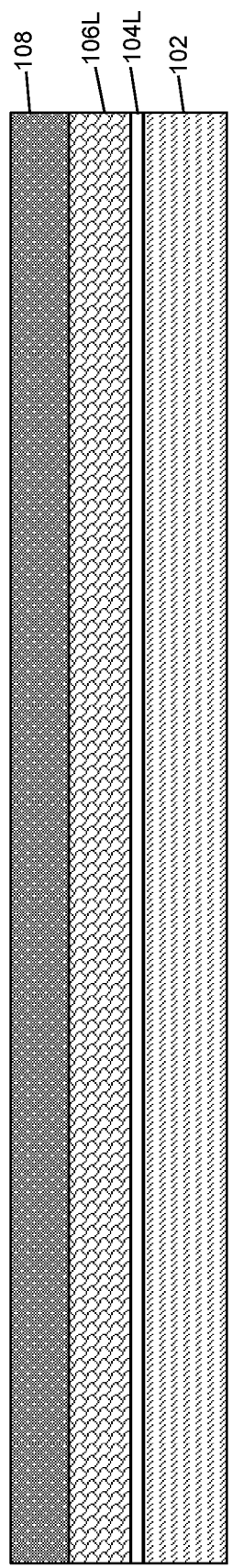
FIG. 1 is a vertical cross-sectional view illustrating a step of forming a continuous gate dielectric layer, a continuous gate layer and photoresist on a substrate in a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form metal-oxide semiconductor field effect transistor (MOSFET) semiconductor devices in which at least some of the MOSFETs have air gaps in at least one sidewall spacer of the MOSFETs. The capacitance of a parallel plate capacitor is described by equation 1 below.

$$C = \frac{Q}{V} = \varepsilon \frac{A}{d} \qquad \text{Equation 1}$$

where Q is the charge on the plates, V is the voltage across the gap between the plates, F is the dielectric constant, A is area of the plates and d is the distance between the plates. Thus, for a given area and distance, the capacitance can be lowered by using material with a lower dielectric constant between the parallel plates than air. Silicon oxide ($SiO_2$) has a dielectric constant of 3.9 while silicon nitride ($Si_3N_4$) has a dielectric constant of 7.9. In contrast, air has a dielectric constant of 1.0. Therefore, by forming air gaps in place of dielectric spacers formed from higher dielectric materials such as silicon oxide or silicon nitride may reduce junction, overlap and/or fringing capacitances in the MOSFET and thereby increase and/or maintain switching speed and/or improve short channel performance which are deleteriously affected by capacitance.

In some embodiments, air gaps are formed in both sidewall spacers of the MOSFETs. In other embodiments, a first portion of the MOSFET has air gaps formed in both sidewall spacers of the MOSFETs while a second portion of the MOSFET has air gaps formed only in one of the sidewall spacers. In other embodiments, a first portion of the MOSFET has air gaps formed in both sidewall spacers of the MOSFETs, a second portion of the MOSFET has air gaps formed only in one of the sidewall spacers and a third portion of the MOSFETs do not have air gaps in the sidewall spacers.

Referring to FIG. 1, a continuous gate dielectric layer 104L, a continuous gate layer 106L and a photoresist layer 108 may be formed on a substrate 102. The substrate 102 may be made of any suitable material, such as silicon, silicon on insulator (SOI) or silicon on sapphire (SOS). The continuous gate dielectric layer 104L may be made of any suitable material, such as an oxide or nitride, such as silicon oxide. Other suitable materials are within the contemplated scope of disclosure. The continuous gate layer 106L may be made of a metal, such as tungsten, nickel, aluminum or alloys thereof or the continuous gate layer 106L may be made of be made of polysilicon. Other suitable materials are within the contemplated scope of disclosure. The photoresist layer 108 may be a positive or negative photoresist. The continuous gate dielectric layer 104L and the continuous gate layer 106L may be formed by any suitable method. For example, the continuous gate dielectric layer 104L and the continuous gate layer 106L may be formed by chemical vapor deposition (CVD), organometallic chemical vapor deposition (OMCVD) or atomic layer deposition (ALD).

Figure 2:
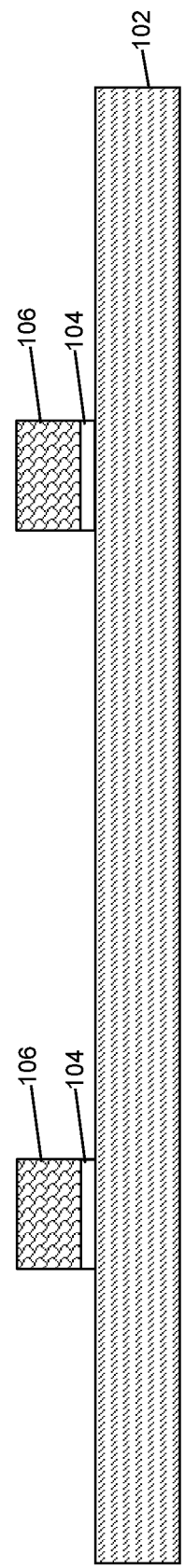
FIG. 2 is a vertical cross-sectional view illustrating a step of patterning the continuous gate dielectric layer and the continuous gate layer in a method for fabricating a semiconductor device in accordance with some embodiments.

Referring FIG. 2, the photoresist layer 108 may lithographically patterned to form an etch mask to form a gate. The photoresist layer 108 may made of either a positive, in which ultraviolet (UV) radiation makes the polymer more soluble and easy to remove or negative photoresist material, in which exposure to UV radiation makes to polymer crosslink and harder to remove. The photoresist layer 108 is exposed to a UV light though a photolithography mask and undesired material removed. An etch process may then be performed to pattern the continuous gate dielectric layer 104L and the continuous gate layer 106L to form patterned gate dielectric layers 104 and patterned gate layers 106. The photoresist may then be removed through an ashing process.

Referring to FIG. 3, the substrate 102 may be subjected to a first ion implantation step 114 to form source extension regions 110 and drain extension regions 112 in the substrate 102. The patterned gate layers 106 may mask portions of the substrate between the source extension regions 110 and the drain extension regions 112. Therefore, the source extension regions 110 and the drain extension regions 112 may be self-aligned to the patterned gate layers 106. Specifically, when the continuous gate layer 106L is patterned and used as a mask to form the source and drain extension regions 110, 112 rather than forming the source and drain extension regions 110, 112 first and then depositing and patterning the continuous gate layer 106L, there is no need to align a separate gate mask to align the patterned gate layers 106 with the source and drain extension regions 110, 112. That is, by using the patterned gate layer 106L as a mask, the source and drain extension regions 110, 112 are automatically aligned (i.e., self-aligned) with the patterned gate layer 106L. The source extension regions 110 and the drain extension regions 112 may be doped either p-type or n-type as desired. Example n-type dopants include, but are not limited to, antimony, arsenic and phosphorous. Example p-type dopants include, but are not limited to boron, aluminum and gallium. The source extension regions 110 and drain extension regions 112 may have an implanted ion concentration of $2 \times 10^{20}$ to $2 \times 10^{21}$. Although, greater or lesser doping concentrations may be used. The regions under the patterned gate layers 106 and patterned gate dielectric layers 104 located between the source extension regions 110 and drain extension regions 112 may constitute channel regions 113.

Referring to FIG. 4, a continuous first oxide layer 116L may be conformally deposited over the substrate 102 and the sidewalls and tops of the patterned gate dielectric layers 104 and patterned gate layers 106. The continuous first oxide layer 116L may be made of any suitable oxide, such as $SiO_2$, $HfO_2$, $Al_2O_3$, $Ta_2O_5$, $ZrO_2$, $TiO_2$. Other suitable materials constituting the continuous first oxide layer 116L are within the contemplated scope of disclosure. The continuous first oxide layer 116L may be formed by any suitable method. For example, the continuous first oxide layer 116L may be formed by chemical vapor deposition (CVD), organometallic chemical vapor deposition (OMCVD) or atomic layer deposition (ALD).

Next, a continuous silicon nitride layer 118L may be conformally deposited over the continuous first oxide layer 116L. Similar to the continuous first oxide layer 116L, the silicon nitride layer 118L may be formed by any suitable method. For example, the silicon nitride layer 118L may be formed by chemical vapor deposition (CVD), organometallic chemical vapor deposition (OMCVD) or atomic layer deposition (ALD).

Referring to FIG. 5, a continuous second oxide layer 120L may be conformally deposited over the continuous silicon nitride layer 118L. In this manner, a continuous oxide/nitride/oxide sandwich layer 122L may be formed over the substrate 102 and the patterned gate dielectric layer 104 and the patterned gate layer 106. The continuous second oxide layer 120L may be made of the same material as the continuous first oxide layer 116L or may be made of a different material. Similar to the continuous first oxide layer 116L, the continuous second oxide layer 120L may be formed by any suitable method. For example, the continuous second oxide layer 120L may be formed by chemical vapor deposition (CVD), organometallic chemical vapor deposition (OMCVD) or atomic layer deposition (ALD).

Referring to FIG. 6, the continuous first oxide layer 116L, the continuous silicon nitride layer 118L and the continuous second oxide layer 120L, i.e. continuous oxide/nitride/oxide (ONO) may combine to form a sandwich structure 122L that may be patterned to form first sidewall spacer 122A and second sidewall spacer 122B adjacent the sidewalls of the patterned gate dielectric layers 104 and the patterned gate layers 106. In this step, a portion of the top surfaces of the source extension regions 110 and the drain extension regions 112 beyond the first and second sidewall spacers 122A, 122B are exposed. The first and second sidewall spacers 122A, 122B may be formed such that the patterned first oxide layer 116 has a thickness $T_{O1}$ in the range of 20 Å-200 Å, the patterned nitride layer has a thickness ($T_N$) in the range of 20 Å-250 Å and the patterned second oxide layer has a thickness ($T_{O2}$) in the range of 100 Å-500 Å.

Referring to FIG. 7, a second ion implantation 124 may be performed. In this step, the exposed portions of the source extension regions 110 and the drain extension regions 112 may ion implanted to form deep source regions 126 adjacent the source extension regions 110 and deep drain regions 128 adjacent the drain extension regions 112. The deep source regions 126 and the deep drain regions 128 may have an implanted ion concentration in the range of $2 \times 10^{21}$ to $2 \times 10^{22}$. Although, greater or lesser doping concentrations may be used. The source extension regions 110 and the deep source regions 126 may be collectively referred to as source regions 127. The drain extension regions 112 and the deep drain regions 128 may be collectively referred to as drain regions 129. The ions implanted in the second ion implantation step 124 may be the same as or different from the ions implanted in the first ion implantation step 114.

Referring to FIG. 8, a silicide layer 130 may be formed on the top surfaces of the deep source regions 126 and the deep drain regions 128. The silicide layer 130 may be formed by depositing a thin layer of metal (not shown) and heating to reaction the metal with the silicon deep source regions 126 and the deep drain regions 128. Further, as illustrated, if the patterned gate layer 106 is made of polysilicon, metal may be deposited on the top surface of the patterned gate layer 106 and heated to form a silicide layer 130 on the top surface of the patterned gate layer 106. Collectively, the patterned gate dielectric layer 104, patterned gate layer 106, first sidewall spacer 122A, second sidewall spacer 122B, source extension regions 110, drain extension regions 112, channel region 113, source regions 127 and drain regions 129 comprise a transistor structure 131. In an embodiment, the transistor structure 131 may be a MOSFET. The silicide 130 formed over the gate electrode 106 as well as deep source regions 126 and deep drain regions 128 may improve conductivity for subsequently formed metal vias that may be coupled to the gate electrode 106 as well as deep source regions 126 and deep drain regions 128.

Figure 9:
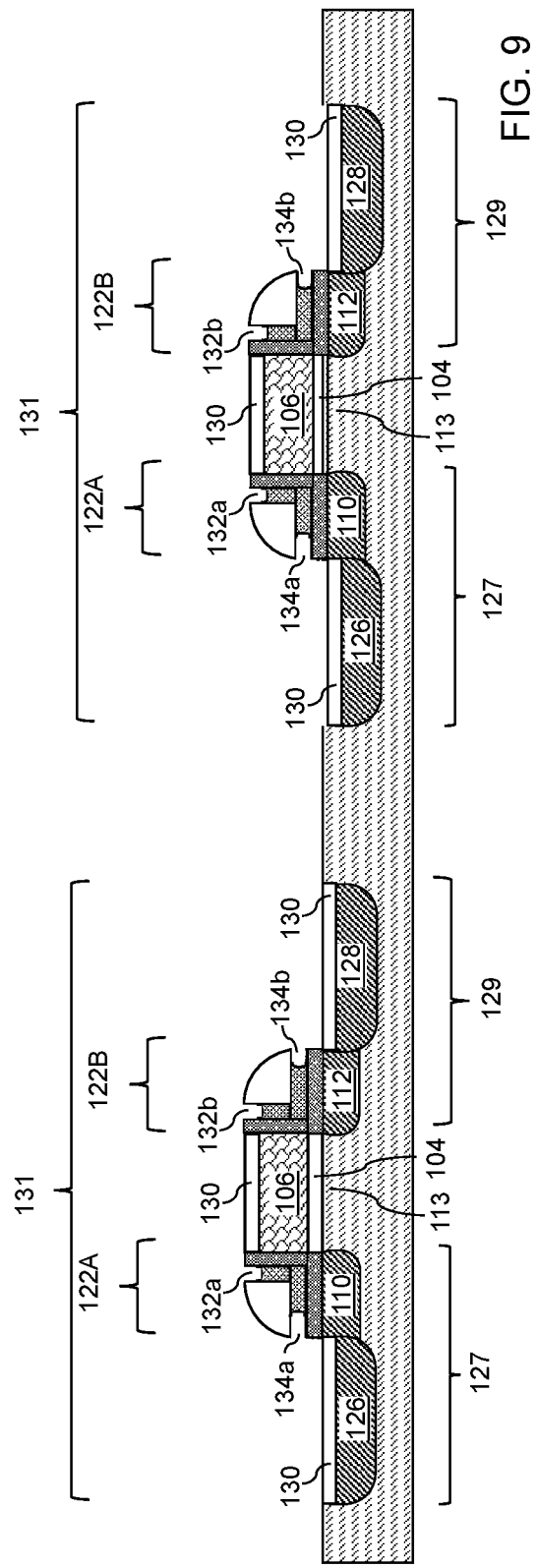
FIG. 9 is a vertical cross-sectional view illustrating a step of forming trenches in the nitride layer of the sidewalls in a method for fabricating a semiconductor device in accordance with some embodiments.

Referring to FIG. 9, the patterned nitride layers 118 in the first sidewall spacer 122A and the second sidewall spacer 122B may be selectively etched relative to the patterned first oxide layers 116 and the patterned second oxide layers 120, such first and third trenches 132a, 132b may be formed in the patterned nitride layers 118 adjacent the patterned gate dielectric layer 104 and the patterned gate layer 106. Further, second and fourth trenches 134a, 134b may be formed over the source or drain extension regions 110, 112. The first, second, third and fourth trenches 132a, 132b, 134a, 134b may be selectively etched with a wet etching process, a dry etching process or a combination of wet and dry etching processes. Thus, first trench 132a and second trench 134a may be formed in the first sidewall spacer 122A. Third trench 132b and fourth trench 134b may be formed in the second sidewall spacer 122B. The first trench 132a and second trench 134a may be referred to as a first pair of trenches. The third trench 132b and fourth trench 134b may be referred to as a second pair of trenches. In various embodiments, the patterned nitride layers 118 may be etched such that the first, and third, trenches 132a, 132b may have a depth between 0.001-0.7× of the total height $H_G$ of the gate as illustrated in FIG. 10B and discussed in more detail below. In some embodiments, the first, and third, trenches 132a, 132b may have a depth between 0.10 and 0.5 of the total height $H_G$ of the gate, such as between 0.2 and 0.4. In various embodiments, the patterned nitride layers 118 may be etched such that the second, and fourth, trenches 134a, 134b may have a depth between 0.001-0.7× the widths $T_{SW}$ of the first and second sidewall spacers 122A, 122B, such as between 0.10 and 0.5, such as between 0.2 and 0.4.

Figure 10A:
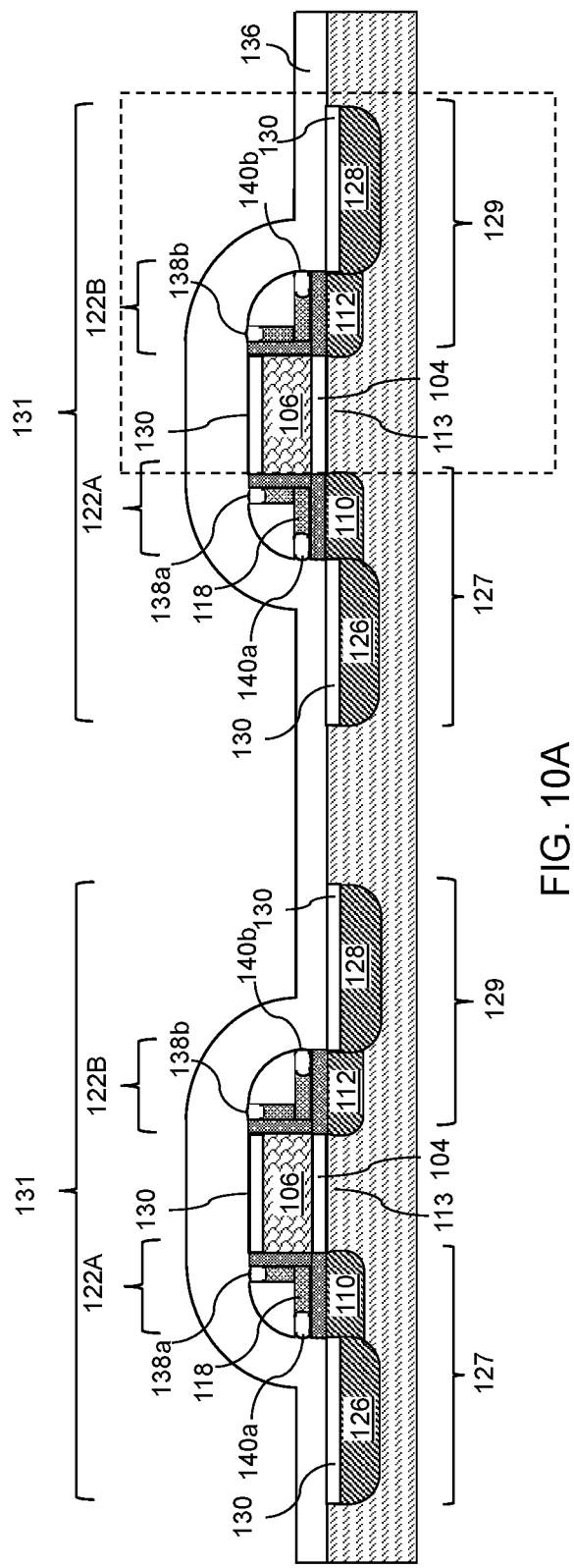
FIG. 10A is a vertical cross-sectional view illustrating a step of forming air gaps in the nitride layer of the sidewalls by depositing an etch stop layer in a method for fabricating a semiconductor device in accordance with some embodiments.
Figure 10B:
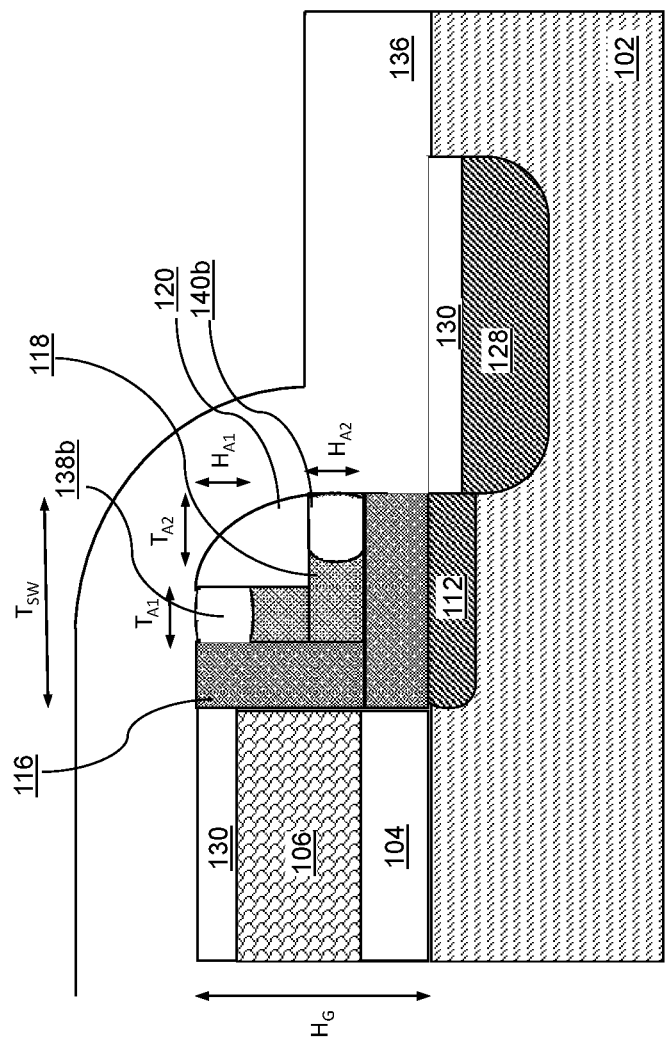
FIG. 10B is a close up view of a portion of FIG. 10A.

Referring to FIGS. 10A and 10B, a contact etch stop layer 136 may be formed over the surface of the substrate 102, the first and second sidewall spacers 122A,122B and the patterned gate layers 106. The contact etch stop layer 136 may be made of any suitable material, such as silicon oxide. Other suitable materials are within the contemplated scope of disclosure. The contact etch stop layer 136 may cover the tops of the first, second, third and fourth trenches 132a, 132b, 134a, 134b without filling the first, second, third and fourth trenches 132a, 132b, 134a, 134b. In this manner, first and third air gaps 138a, 138b and second and fourth air gaps 140a, 140b may be formed in the patterned nitride layer 118 of the first and second sidewall spacers 122A, 122B. The first air gap 138a and second air gap 140a may be referred to as a first pair of air gaps. The third air gap 138b and fourth air gap 140b may be referred to as a second pair of air gaps.

The dimensions of the first, second, third and fourth air gaps 138a, 140a, 138b, 140b may be controlled by the thickness of the patterned nitride layer 118 as well as the etch time of the selective etching of the patterned nitride layer 118. The thickness of the patterned nitride layer 118 may determine the thickness of air gaps 138a, 138b and depth of air gaps 140a, 140b as illustrated in FIG. 10B and discussed in more detail below. The thickness of the patterned first oxide layer 116 may be between 20 Å and 200 Å. The thickness of the patterned nitride layer 118 may be between 20 Å and 250 Å. The thickness of the patterned second oxide layer 120 may be between 100 Å and 500 Å. Similarly, the length of the etch time of the selective etching of the patterned nitride layer 118 may determine the depth of the air gaps 138a, 138b and the thickness of air gaps 140a, 140b. Thus, the dimensions of the first, second, third, and/or fourth air gaps 138a, 140a, 38b, 1140b may be selected as desired based on the configuration of the device being fabricated. Note, if the thickness of the patterned nitride layer 118 is too large, the first and third trenches 138a, 138b may fill with contact etch stop layer material when the contact etch stop layer 136 is deposited, reducing or eliminating the first and third air gaps 138a, 138b, If the thicknesses and or heights of the first, second, third, and/or fourth air gaps, 138a, 140a, 138b, 140b are wo small, the first, second, third, and/or fourth air gaps 138a, 140a, 38b, 40b may not provide the desired reduction in parasitic and/or fringing capacitance.

With reference to FIGS. 6 and 10B, the total height $H_G$ of the gate, includes the patterned gate dielectric layer 104, the patterned gate layer 106 and silicide layer 130. The total spacer width $T_{SW}$ of the first and second sidewall spacers 122A, 122B includes the thickness $T_{O1}$ of the patterned first oxide layer 116, the thickness $T_N$ of the patterned nitride layer 118 and the thickness $T_{O2}$ of the patterned second oxide layer 120 at its thickest, as illustrated in FIG. 6 and discussed above. As discussed above, the first and second sidewall spacers 122A, 122B may be formed such that the patterned first oxide layer 116 has a thickness $T_{O1}$ in the range of 20 Å-200 Å, the patterned nitride layer has a thickness ($T_N$) in the range of 20 Å-250 Å and the patterned second oxide layer has a thickness ($T_{O2}$) in the range of 100 Å-500 Å

As discussed above, replacing a higher dielectric material such as silicon oxide or silicon nitride with a lower dielectric material (e.g., air) between the charge carrying plates may reduce parasitic and fringing capacitances that are unintentionally created. If only a portion of the higher dielectric material in a layer is replaced with a lower dielectric material, the dielectric constant of the mixed material (and therefore, the capacitance) is determined by the weighted average of the amount of the higher and lower dielectric materials. Thus, by increasing the size of the air gap, parasitic and fringing capacitance may be reduced. In embodiments, the height $H_{A1}$ of the first (or third) air gap 138a, 138b may be between 0.001-0.7× the total height $H_G$ of the gate, such as between 0.10 and 0.5 times the total height $H_G$ of the gate, such as between 0.2 and 0.4 times the total height $H_G$ of the gate. The thickness $T_{A1}$ of the first (or third) air gap 138a, 138b may be equal to, smaller or larger than the thickness of the patterned $Si_3N_4$ layer 118. The thickness $T_{A1}$ of the first (or third) air gap 138a, 138b may be in the range of 20 Å-250 Å. The height $H_{A2}$ of the second (or fourth) air gap 140a, 140b may be equal to, smaller or larger than the thickness of the patterned $Si_3N_4$ layer 118. The height $H_{A2}$ of the second (or fourth) air gap 140a, 140b may be in the range of 20 Å-250 Å. The thickness $T_{A2}$ of the second (or fourth) air gap 140a, 140b may be between 0.001-0.7× the widths $T_{SW}$ of the first and second sidewall spacers 122A, 122B. In an embodiment, the size of the first pair of air gaps may be of a different size than the second pair of air gaps. For example, in an embodiment, the first and third air gaps 138a, 138b may have a volume of 10-90% of the second and fourth air gaps, 140a, 140b.

Figure 11:
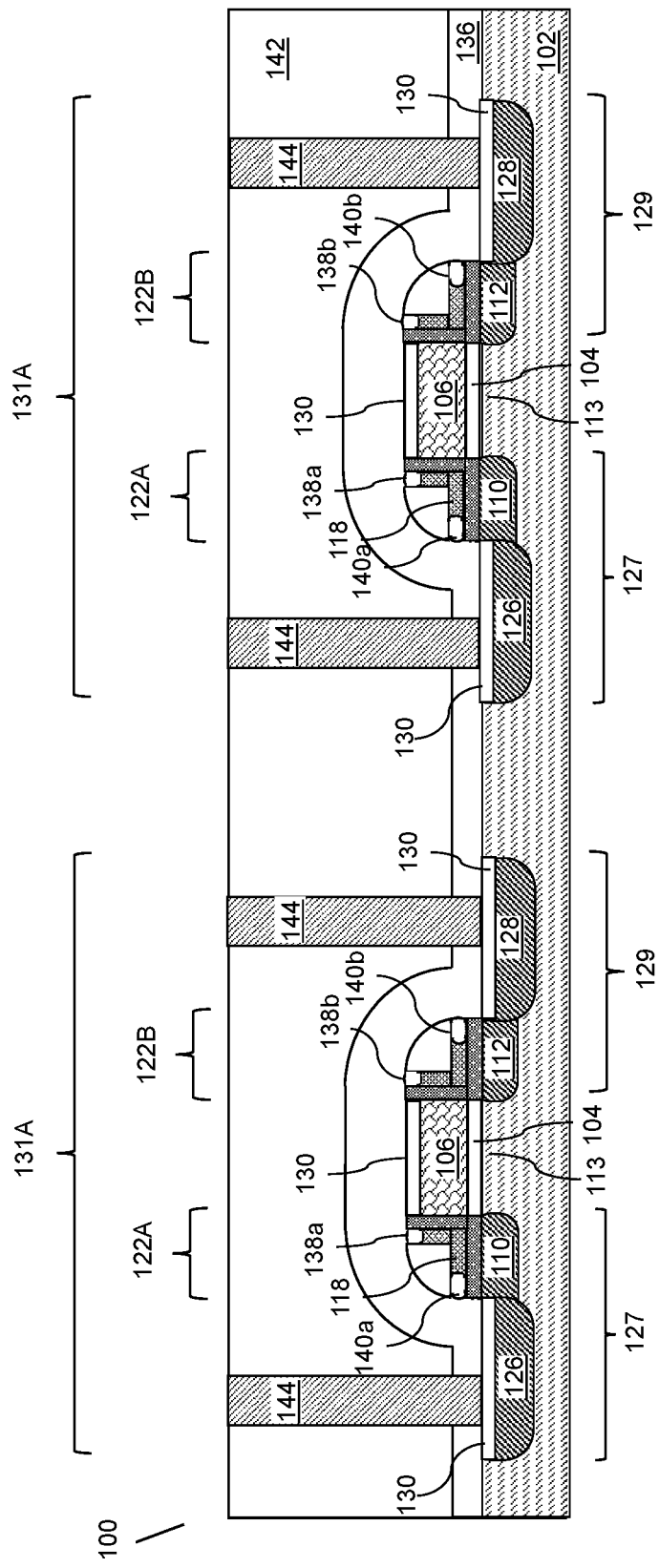
FIG. 11 is a vertical cross-sectional view illustrating a step of forming an interdielectric layer and source/drain electrodes in a method for fabricating a semiconductor device in accordance with some embodiments.

Referring to FIG. 11, an interdielectric layer 142 may be deposited over the contact etch stop layer 136. Then, a photoresist layer (not shown) may be deposited and patterned top form via holes (not shown) in the interdielectric layer 142 and the contact etch stop layer 136 and filled with metal, such as W, Cu, Co, Mo, Ru, other elemental metals, or an alloy or a combination thereof. Other suitable materials are within the contemplated scope of disclosure. In this manner, contact vias 144 coupled to the source and drain regions 127, 129 may be formed to complete the integrated semiconductor device 100. The resulting the integrated semiconductor device 100 includes transistor structures 131A in which both the first and second sidewall spacers 122A, 122B have a pair of air gaps (first, second, third and fourth air gaps, 138a, 140a, 138b, 140b).

In some device configurations, adjacent pairs of MOSFETs share a common gate. In these configurations, it may be unnecessary to fabricate one or more of the first, second, third or fourth air gaps 138a, 140a, 138b, 140b. Further, in other device configurations, the spacing between adjacent MOSFETs may not be symmetric. That is, the spacing on the source side between adjacent MOSFETs may be different from the spacing between MOSFETs on the drain side. In these configurations as well, it may be unnecessary to fabricate one or more of the first, second, third or fourth air gaps 138a, 140a, 138b, 140b. In still other configurations, capacitances between the patterned gate layer 106 and the source/drain electrodes 144 may be small enough such that the first and third airgaps 138a, 138b are unnecessary. In other configurations, capacitances between the patterned gate layer 106 and the source/drain regions 127, 129 may be small enough such that the second and fourth airgaps 140a, 140b are unnecessary. FIGS. 12,13 and 15-23 illustrate various embodiments with different combinations of the various air gaps, such as one or more the first, second, third or fourth air gaps 138a, 140a, 138b, 140b and methods of making these embodiments.

Figure 12:
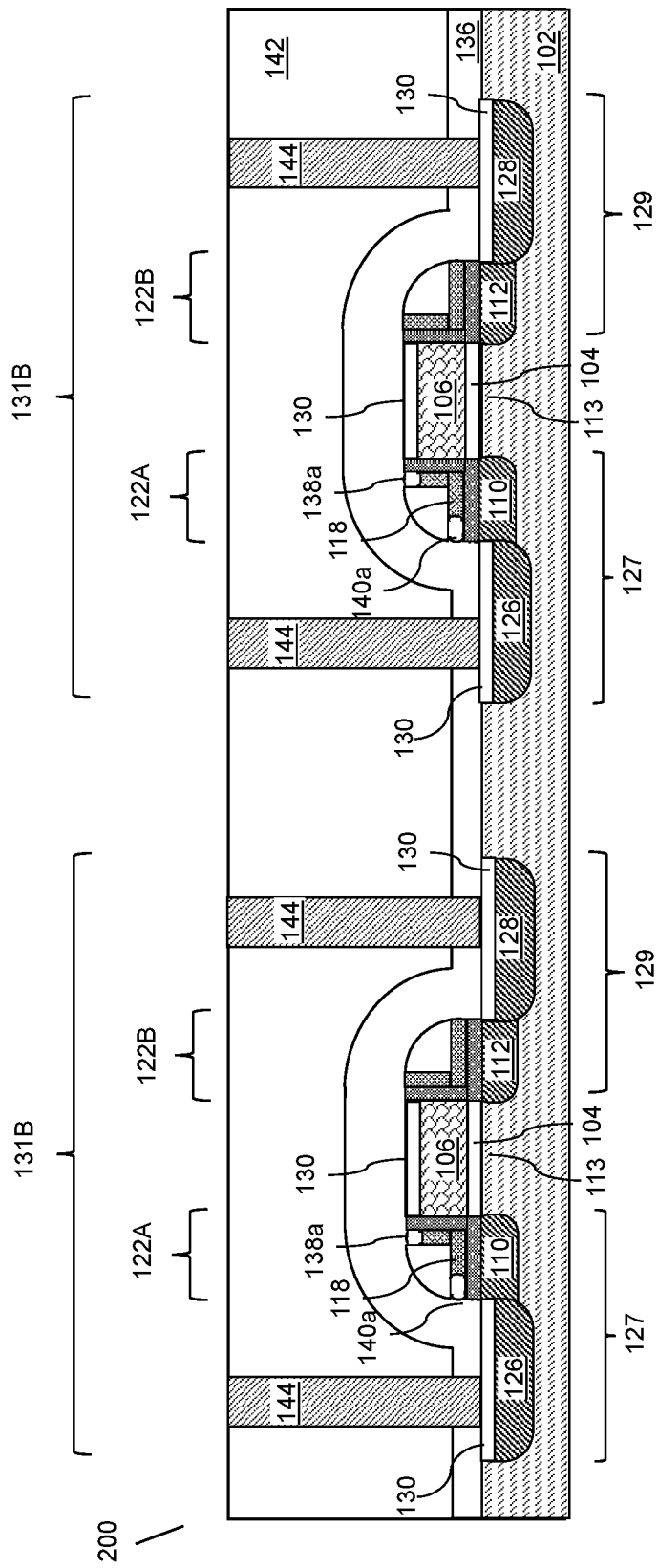
FIG. 12 is a vertical cross-sectional view illustrating a semiconductor device having air gaps in only one of the sidewalls in accordance with some embodiments.

FIG. 12 illustrates another embodiment of an integrated semiconductor device 200 in which first and second air gaps 138a, 140a may be formed only over the source regions 127 or third and fourth air gaps 138b, 140b may be formed the drain regions 129 but not both the source and drain regions 127, 129 of the same transistor structure 131b. For example, FIG. 12 illustrates first and second air gaps 138a and 140a formed only over source regions 127, while no air gaps are formed over drain regions 129. Alternatively, first and second air gaps 138b and 140b formed only over drain regions 129, while no air gaps are formed over source regions 127.

To form the embodiment structure illustrated in FIG. 12, the method as discussed above may be followed up to the step illustrated in FIG. 8. Then, a photoresist layer 108 may be deposited over the entire surface and patterned such that only the source regions 127 or the drain regions 129 may be exposed. In this manner, the photoresist 108 protects the covered first or second sidewall spacer 122A, 122B while the exposed first or second sidewall spacer 122A, 122B is etched. Fabrication may then proceed as illustrated in FIG. 9. That is, first and second trenches 132a, 134a may be formed in the exposed sidewall spacer 122A. In an alternative embodiment, third and fourth trenches 132b, 134b may be formed in the exposed sidewall spacer 122B. Next, the photoresist layer 108 may be removed and the etch stop layer 136 deposited as illustrated FIGS. 10A, 10B to effectively form first and second airgaps 138a, 140a or third and fourth air gaps 138b, 140b. The resulting integrated semiconductor device 200 includes transistor structures 131B in which one of the first or second sidewall spacers 122A, 122B has a pair of airgaps (first, second, third and fourth air gaps, 138a, 140a, 138b, 140b) and the other of the first or second sidewall spacers 122A, 122B does not have air gaps.

Figure 13:
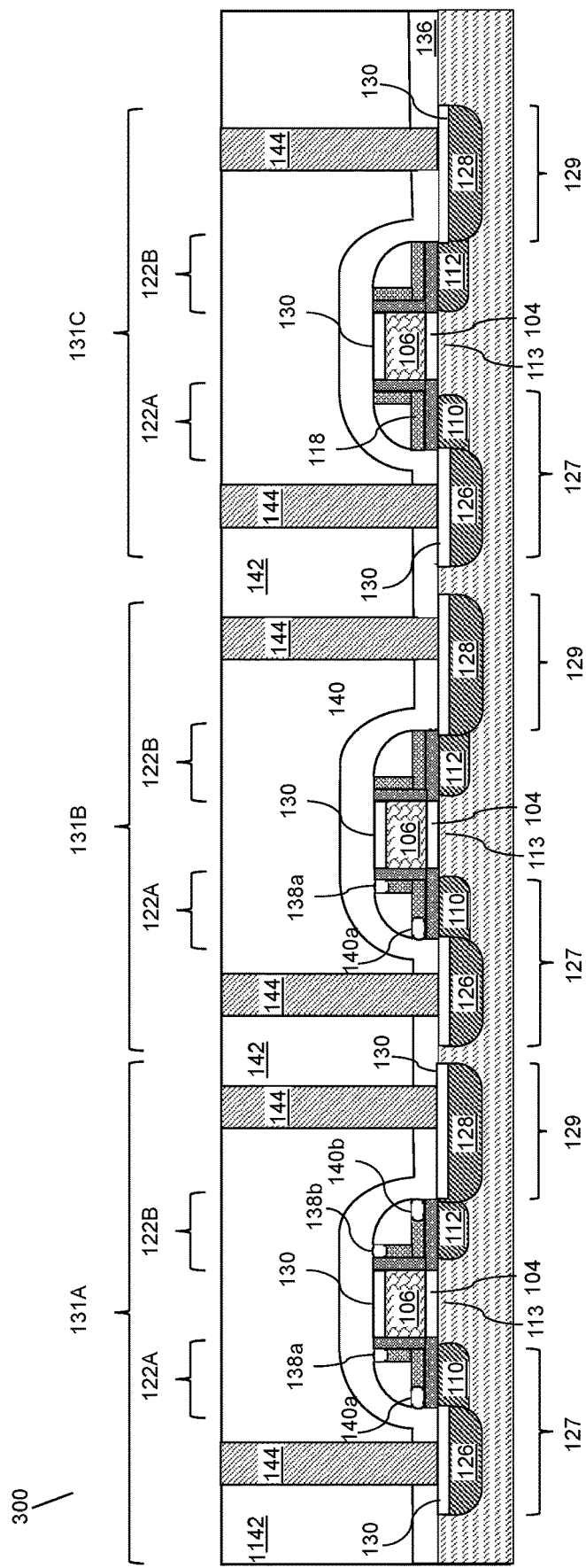
FIG. 13 is a vertical cross-sectional view illustrating a semiconductor device in which a first transistor structure may have air gaps in both sidewalls, a second transistor structure may have air gaps in one sidewall and a third transistor structure may have no air gaps in the sidewalls.
Figure 14:
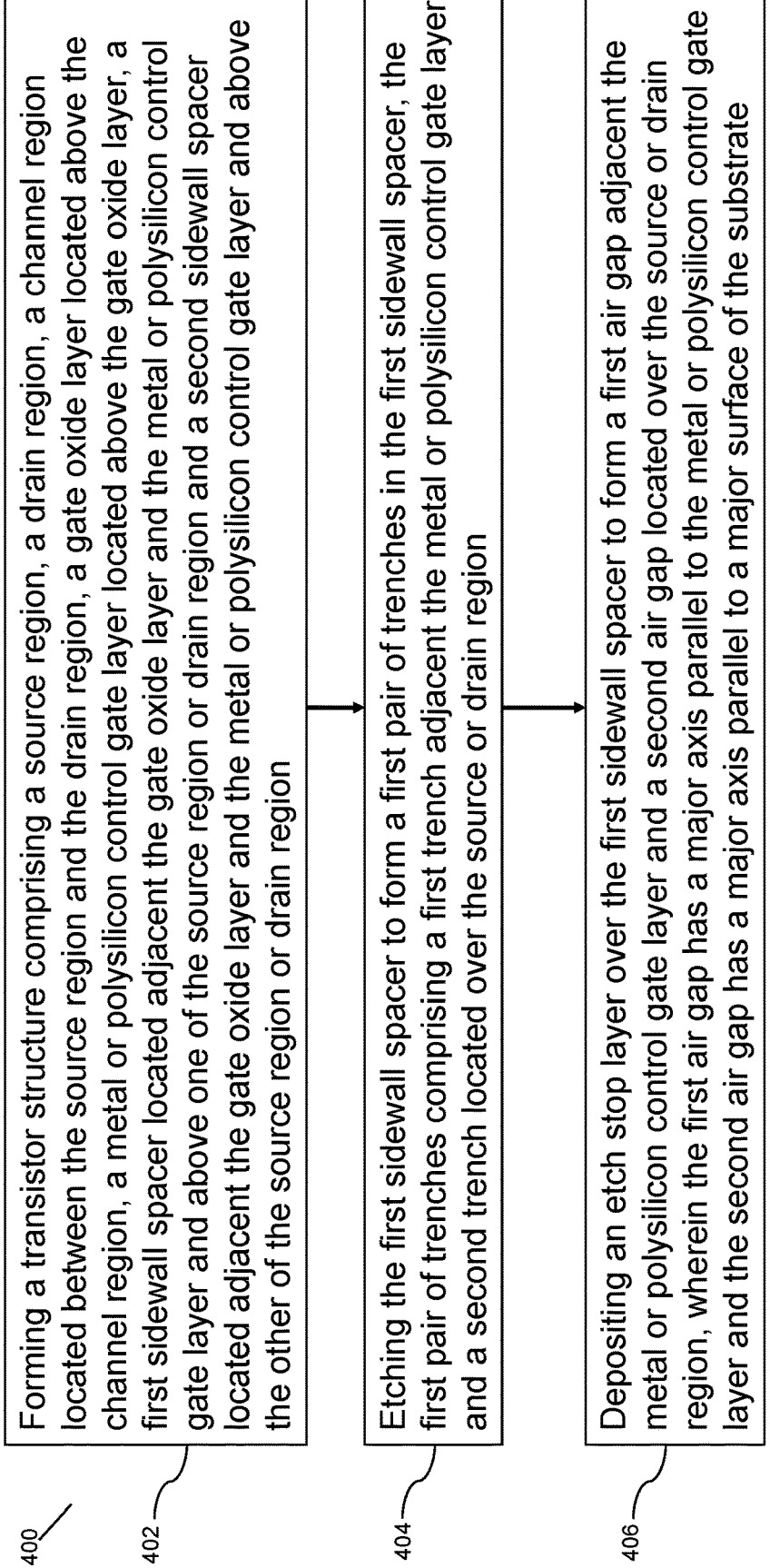
FIG. 14 is a flowchart illustrating a method of making a semiconductor device having air gaps in accordance with some embodiments.

FIG. 13 illustrates another embodiment of an integrated semiconductor device 300 Integrated semiconductor device 300 includes transistor structures 131A in which both the first and second sidewall spacers 122A, 122B have a pair of airgaps (first, second, third and fourth air gaps, 138a, 140a, 138b, 140b), transistor structures 131B in which one of the first or second sidewall spacers 122A, 122B has a pair of airgaps (first, second, third and fourth air gaps, 138a, 140a, 138b, 140b) and the other of the first or second sidewall spacers 122A, 122B does not have air gaps and transistor structures 131C in which neither of the first and second sidewall spacers 122A, 122B have a pair of airgaps To form the embodiment structure illustrated in FIG. 13, the method as discussed above may be followed up to the step illustrated in FIG. 8. Similarly to the embodiment illustrated in FIG. 12, a photoresist layer 108 may be deposited over the entire surface and patterned. In this embodiment, a first portion of the MOSFETs have exposed first and second sidewall spacers 122A, 122B, a second portion of the MOSFETs have only first or second sidewall spacers 122A, 122B exposed, while a third portion of the MOSFETs do not have exposed sidewall spacers. Fabrication may then proceed as illustrated in FIG. 9. That is, first, second, third and fourth trenches 132a, 134a, 132b, 134b may be formed in the exposed sidewall spacer 122A and 122B of the first portion. In addition, first and second trenches 132a, 134a may be formed in first sidewall spacer 122A (or alternatively third and fourth trenches 132b, 134b may be formed in second sidewall spacer 122B) of a second portion. Next, the photoresist layer 108 may be removed and the etch stop layer 136 deposited as illustrated FIGS. 10A, 10B, Referring to FIG. 14, a flowchart illustrates a general method 400 of making a semiconductor device 100, 200, 300 having first, second, third and fourth air gaps 138a, 140a, 138b, 140b in accordance with some embodiments. Referring to step 402, a transistor structure 131 including a source region 127, a drain region 129, a channel region 113 located between the source region 127 and the drain region 129, a gate dielectric layer 104 located above the channel region 113, a metal or polysilicon gate layer 106 located above the gate dielectric layer 104, a first sidewall spacer 122A located adjacent the gate dielectric layer 104 and the metal or polysilicon gate layer 106 and above one of the source region 127 or drain region 129 and a second sidewall spacer 122B located adjacent the gate dielectric layer 104 and the metal or polysilicon gate layer 106 and above the other of the source region 127 or drain region 129 may be formed.

Referring to step 404, the nitride layer 118 of first sidewall spacer 122A may be etched selective to the first and second oxide layers 116, 120 to form a first and second trenches 132a, 134a in the first sidewall spacer 122A. The first and second trenches 132a, 134a may include a first trench 132a adjacent the metal or polysilicon gate layer 106 and a second trench 134a located over the source or drain regions 127, 129. The depth of the first and second trenches 132a, 134a may be controlled based on the etch time. That is, the longer the etching, the deeper the trenches that may be formed. The actual etch time for a desired depth depends on the etchant used and the desired depth of the trenches. For example, when etching with phosphoric acid, the rate of etching may be slowed by increasing the water content of the acid. However, the rate of etching may be increased by increasing the temperature. Further, as discussed above, to make the embodiments illustrated in FIGS. 12 and 13 one or both sidewall spacers 122A, 122B of portion of the MOSFETs may be protected with a photoresist layer 108 while the exposed spacers are etched to make first, second, third, and fourth trenches 132a, 134a, 132b, 134b.

Referring to step 406, an etch stop layer 136 may be deposited over the first sidewall spacer 122A to form a first air gap 138a adjacent the metal or polysilicon gate layer 106 and a second air gap 140a located over the source or drain regions 127, 129. The first air gap 138a may have a major axis parallel to the metal or polysilicon gate layer 106 and the second air gap 140a has a major axis parallel to a major surface of the substrate 102.

Generally, the structures and methods of the present disclosure may be used to form metal oxide semiconductor field effect transistor (MOSFET) semiconductor devices in which at least some of the MOSFETs have air gaps in at least one sidewall spacer of the MOSFETs. The air gaps may reduce junction, overlap and/or fringing capacitances in the MOSFET relative to MOSFET made with high dielectric materials by lowering the dielectric constant of the sidewall spacers 122A, 122B and thereby increase switching speed and/or improve short channel performance which are deleteriously affected by capacitance. In some embodiments, air gaps are formed in both sidewall spacers of the MOSFETs. In other embodiments, a first portion of the MOSFET have air gaps formed in both sidewall spacers of the MOSFETs while a second portion of the MOSFET have air gaps formed only in one of the sidewall spacers. In other embodiments, a first portion of the MOSFET have air gaps formed in both sidewall spacers of the MOSFETs, a second portion of the MOSFET have air gaps formed only in one of the sidewall spacers and a third portion of the MOSFETs do not have air gaps in the sidewall spacers.

An embodiment is drawn to a metal oxide semiconductor transistor located on a substrate including a source region 127, a drain region 129, a channel region 113 located between the source region 127 and the drain region 129, a gate dielectric layer 104 located above the channel region 113, a gate layer 106 located above the gate dielectric layer 104, a first sidewall spacer 122A located adjacent the gate dielectric layer 104 and the gate layer 106 and above one of the source region 127 or drain region 129, a second sidewall spacer 122B located adjacent the gate dielectric layer 104 and the gate layer 106 and above the other of the source region 127 or drain region 129 and first and second air gaps 138a, 140a located in the first sidewall spacer 122A comprising a first air gap 138a adjacent the patterned gate layer 106 and a second air gap 140a located over the source or drain region 127, 129, wherein the first air gap 138a has major axis parallel to the gate layer 106 and the second air gap 140a has a major axis parallel to a major surface of the substrate 102.

Figure 15A:
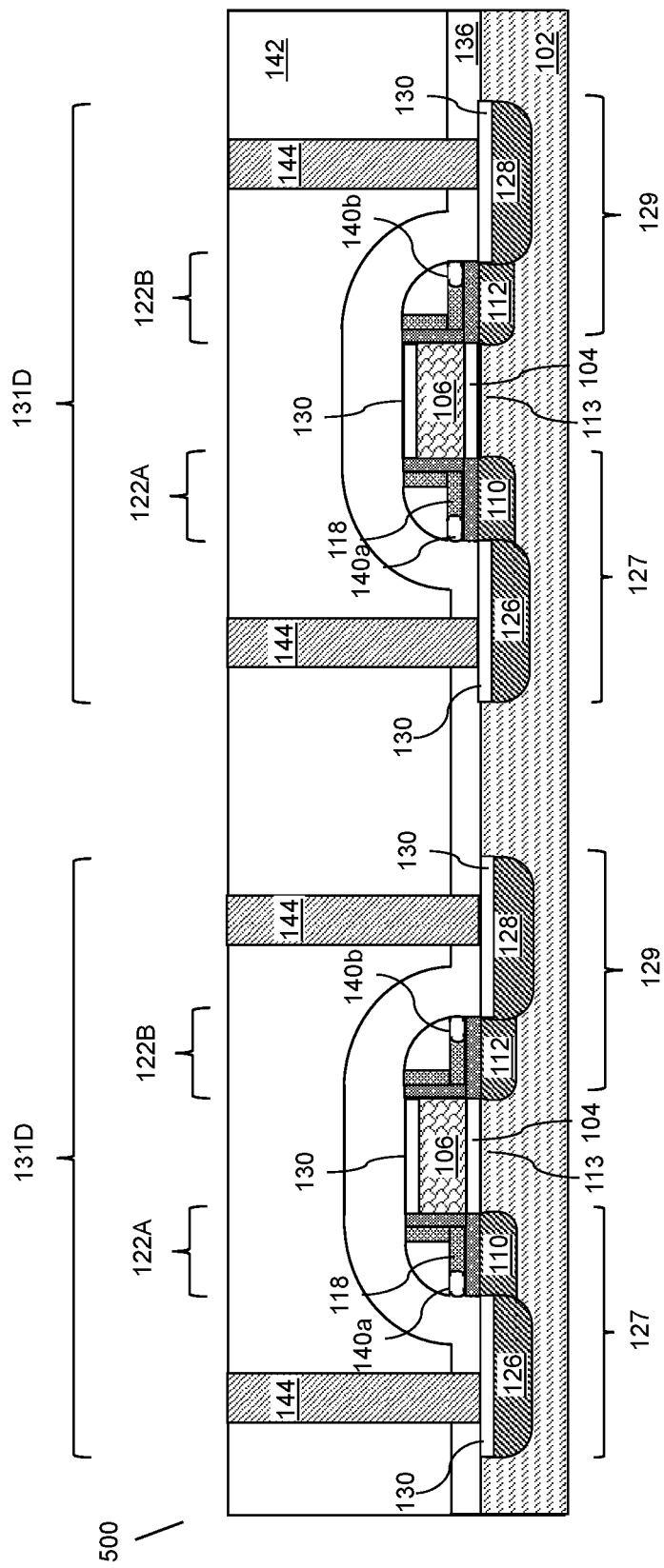
FIG. 15A is a vertical cross-sectional view illustrating a semiconductor device in which air gaps are formed in the sidewalls only over the source and/or drain extension regions.

FIG. 15A illustrates another embodiment of an integrated semiconductor device 500 in which second and fourth air gaps 140a, 140b may be formed in the first and second sidewalls 122A, 122B over the source or drain extension regions 110, 112, but not adjacent to the gate layer 106. In a first embodiment of the method of making integrated semiconductor device 500, a "thick" continuous nitride layer 118L may be deposited. When the thickness $T_N$ of the patterned nitride layer 118 is above a threshold thickness, the first and third trenches 132a, 132b that may be formed therein may also have a thickness that is above a threshold thickness. As a result, the first and third trenches 132a and 132b may fill with contact etch stop layer 136 material when the contact etch stop layer 136 is formed over the first and second sidewall spacers 122A, 122B. Thus, in some embodiments, the first and third air gaps 138a, 138b may not be formed in the first and second sidewall spacers 122A, 122B. However, in such embodiments, the second and fourth trenches 134a, 134b may not be filled due to the horizontal orientation of the second and fourth trenches 134a, 134b. In such an embodiment, a transistor structure 131 may be formed in which only second and fourth air gaps 140a, 140b are formed in the first and second sidewalls 122A, 122B over the source or drain extension regions 110, 112. The resulting the integrated semiconductor device 500 includes transistor structures 131D in which both the first and second sidewall spacers 122A, 122B have a one airgap (second and fourth air gaps, 140a, 140b) over the source and drain extension regions 110, 112.

Figure 15B:
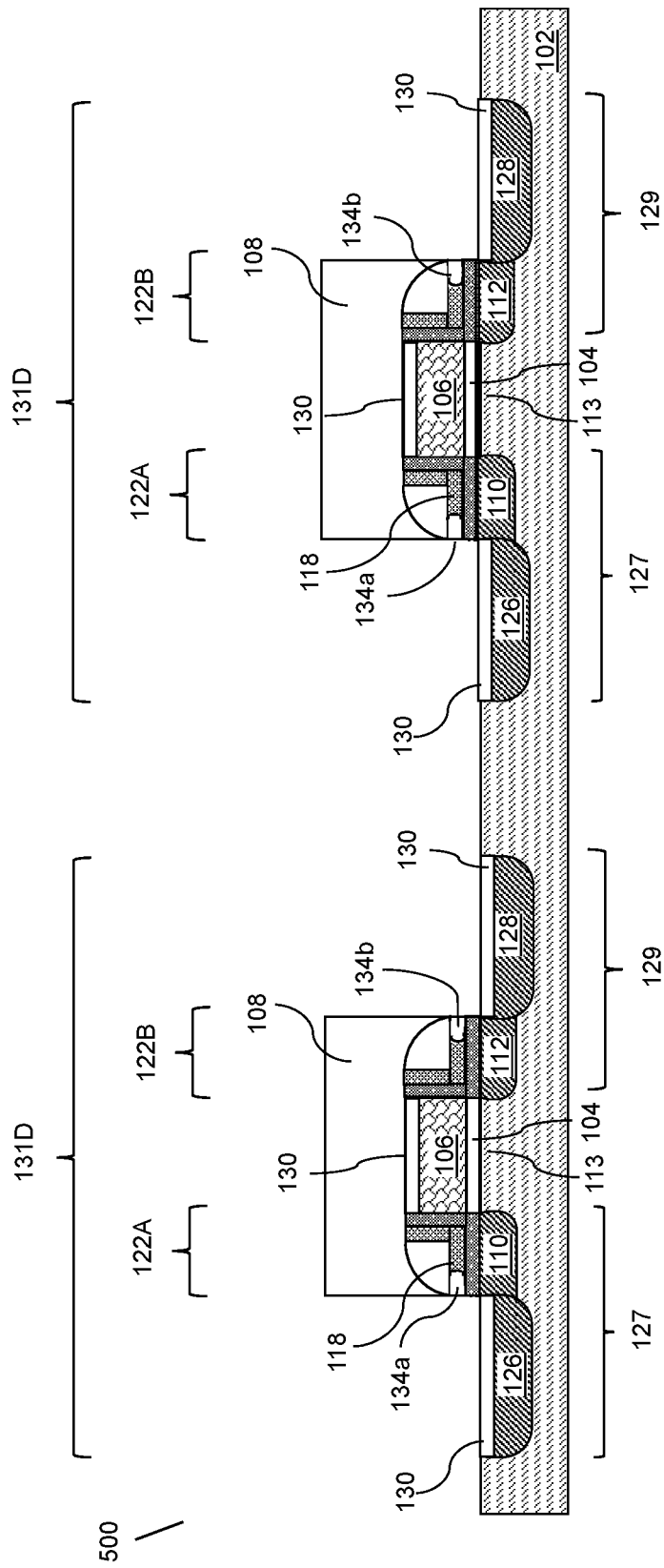
FIG. 15B is a vertical cross-sectional view illustrating a step of forming and patterning a photoresist layer over the structure illustrated in FIG. 8 for fabricating the device illustrated in FIG. 15A.
Figure 15C:
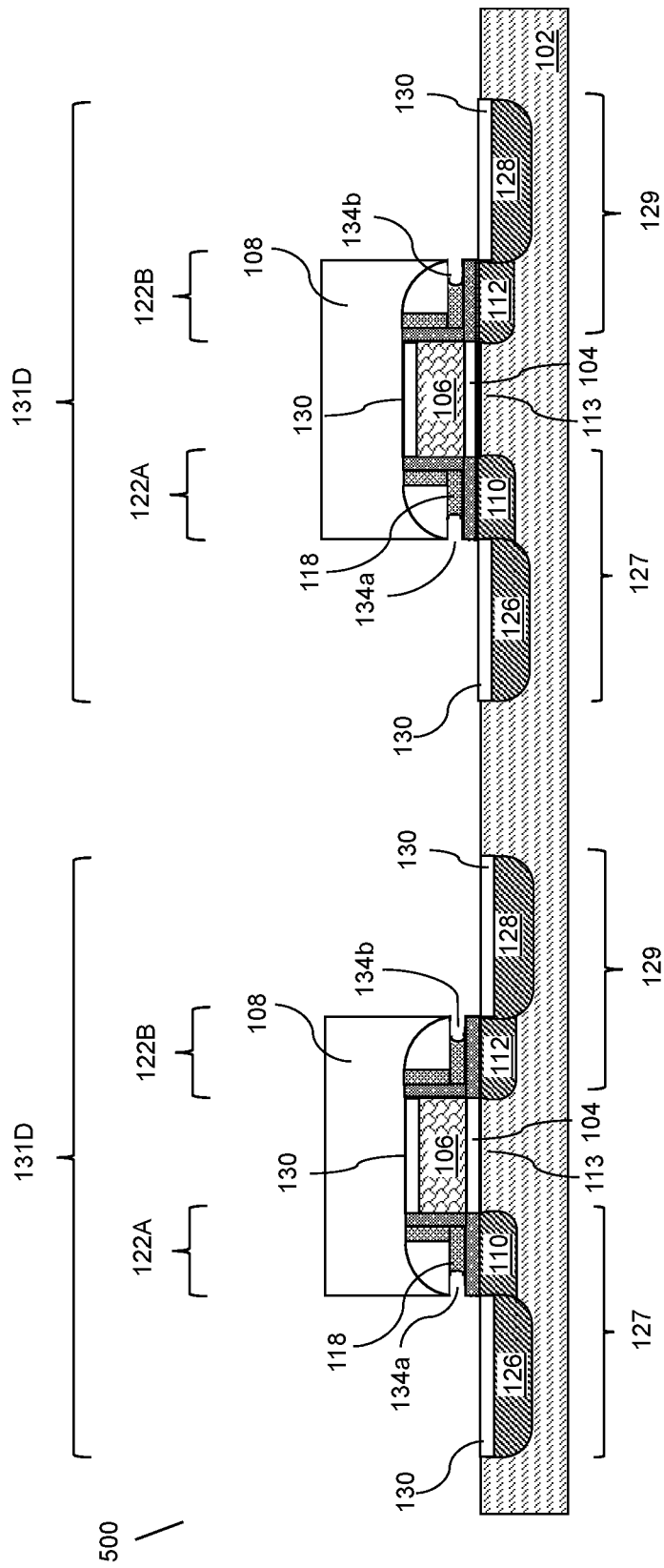
FIG. 15C is a vertical cross-sectional view illustrating a step of forming trenches in the nitride layer of the sidewalls in a method for fabricating the device illustrated in FIG. 15A.

A second embodiment method of making integrated semiconductor device 500 is illustrated in FIGS. 15B and 15C. Referring to FIG. 15B, in the second embodiment method of making integrated semiconductor device 500, a photoresist layer 108 may be deposited over the structure illustrated in FIG. 8 discussed above. The photoresist 108 may then be patterned such that only the horizontal ends of the patterned silicon nitride layer 118 are exposed.

Referring to FIG. 15C, selective etching of the silicon nitride layer may then be performed as illustrate in FIG. 9 and discussed above. After the desired thickness of the second and fourth trenches 134a, 134b in the first and second sidewall spacers 122A, 122B is reached, the photoresist layer 108 may be removed and a contact etch stop layer 136 deposited as illustrated in FIGS. 10A and 10B and discussed above. The interlayer dielectric 142 may then be deposited and the source and drain electrodes 144 fabricated as illustrated in FIG. 11 and discussed above.

Figure 16:
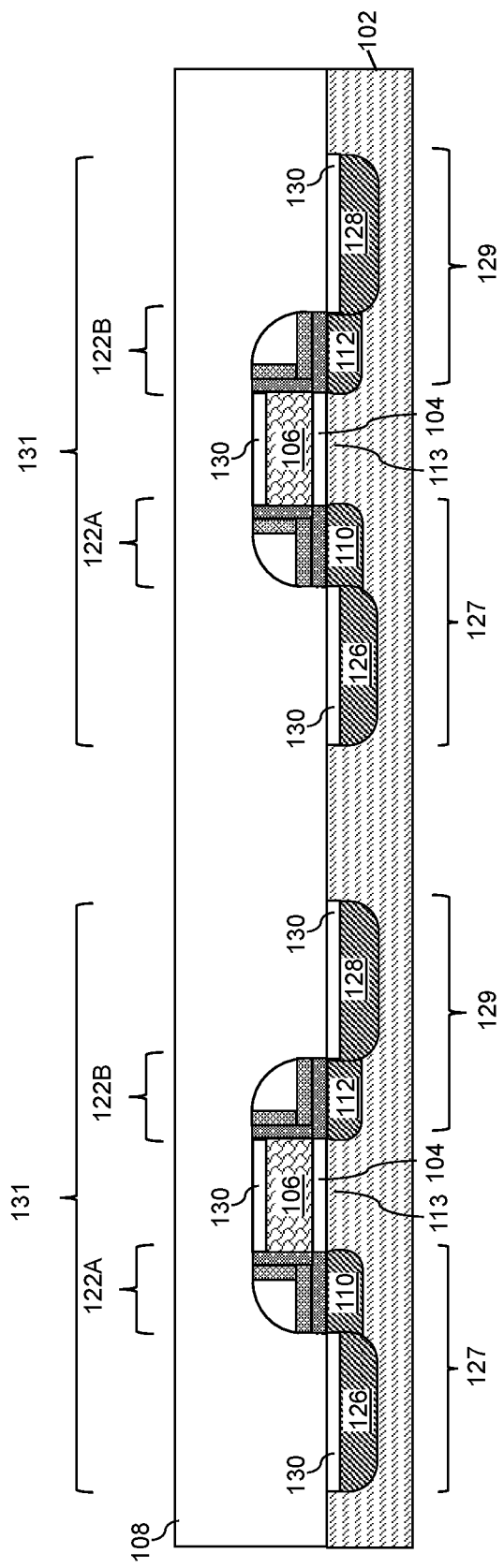
FIG. 16 is a vertical cross-sectional view illustrating a step of forming a photoresist layer over the structure illustrated in FIG. 8 in another method for fabricating a semiconductor device in accordance with some embodiments.
Figure 17:
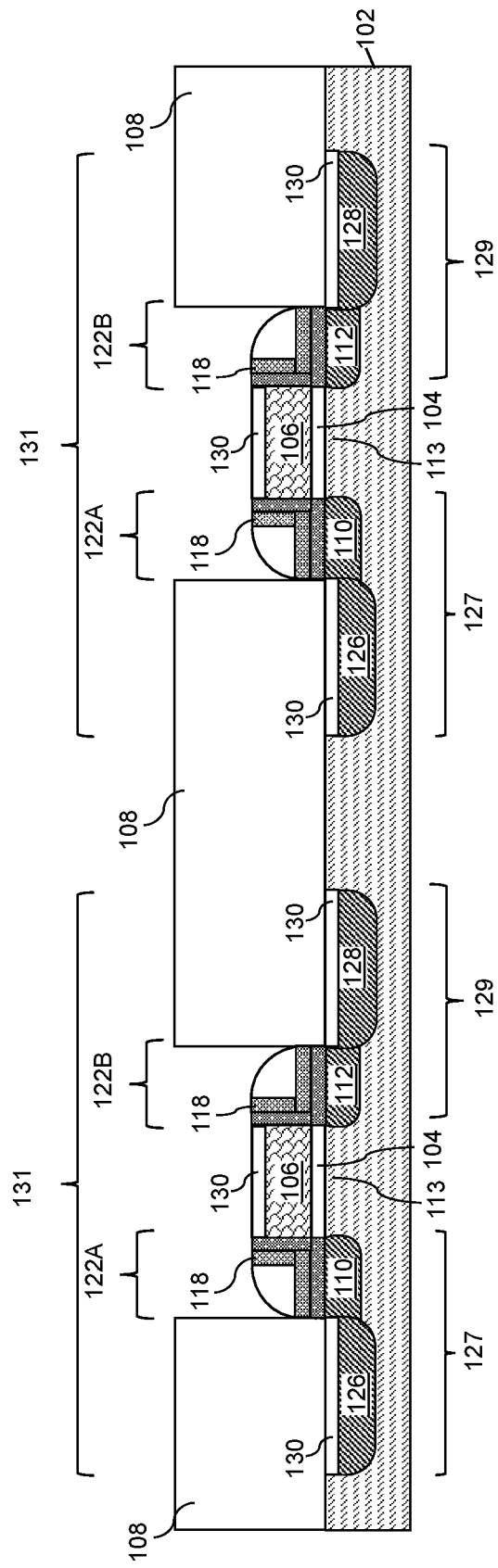
FIG. 17 is a vertical cross-sectional view illustrating a step of patterning a photoresist layer to form a first portion of transistor structures with air gaps in a portion of the sidewall spacers next to the gate and a second portion of transistor structures with air gaps in a portion of the sidewall spacers over the source/drain regions in the other method for fabricating a semiconductor device in accordance with some embodiments.

FIGS. 16-20 illustrates steps in another method of making an integrated semiconductor device 600 according to embodiments. Referring to FIG. 16, a photoresist layer 108 may be deposited over the structure illustrated in FIG. 8 discussed above. Referring to FIG. 17 the photoresist layer 108 may be patterned to expose the first and second sidewall spacers 122A, 122B. As illustrated, the top surface of the silicided layer 130 of the patterned gate layer 106 may also be exposed. As illustrated in regards to FIG. 9 and discussed above, the selective etches used to selectively etch the patterned silicon nitride layer 118 do not appreciably etch the silicide layer 130. In an alternative embodiment of the method, only the first and second sidewall spacers 122A, 122B may be exposed when pattering the photoresist 108.

Figure 18:
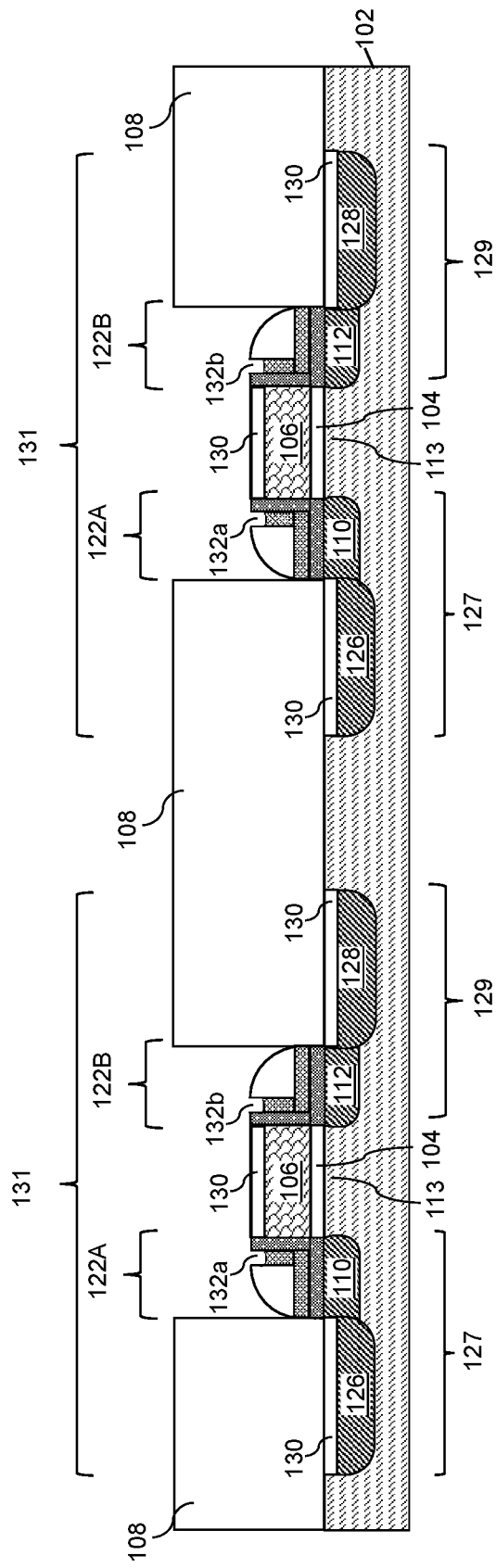
FIG. 18 is a vertical cross-sectional view illustrating a step of forming trenches in the first portion of the transistor structures to form air gaps in a portion of the sidewall spacers next to the gate and forming trenches in the second portion of the transistor structures to form air gaps in a portion of the sidewall spacers over the source/drain regions in the other method for fabricating a semiconductor device in accordance with some embodiments.

Referring to FIG. 18, the patterned silicon nitride layer 118 adjacent the patterned gate dielectric layer 104 and the patterned gate layer 106 may be selectively etched to form first and third trenches 132a, 132b. However, the portions of the patterned silicon nitride layer 118 over the source or drain extension regions 110, 112 are not etched because they are protected by the photoresist layer 108.

Figure 19:
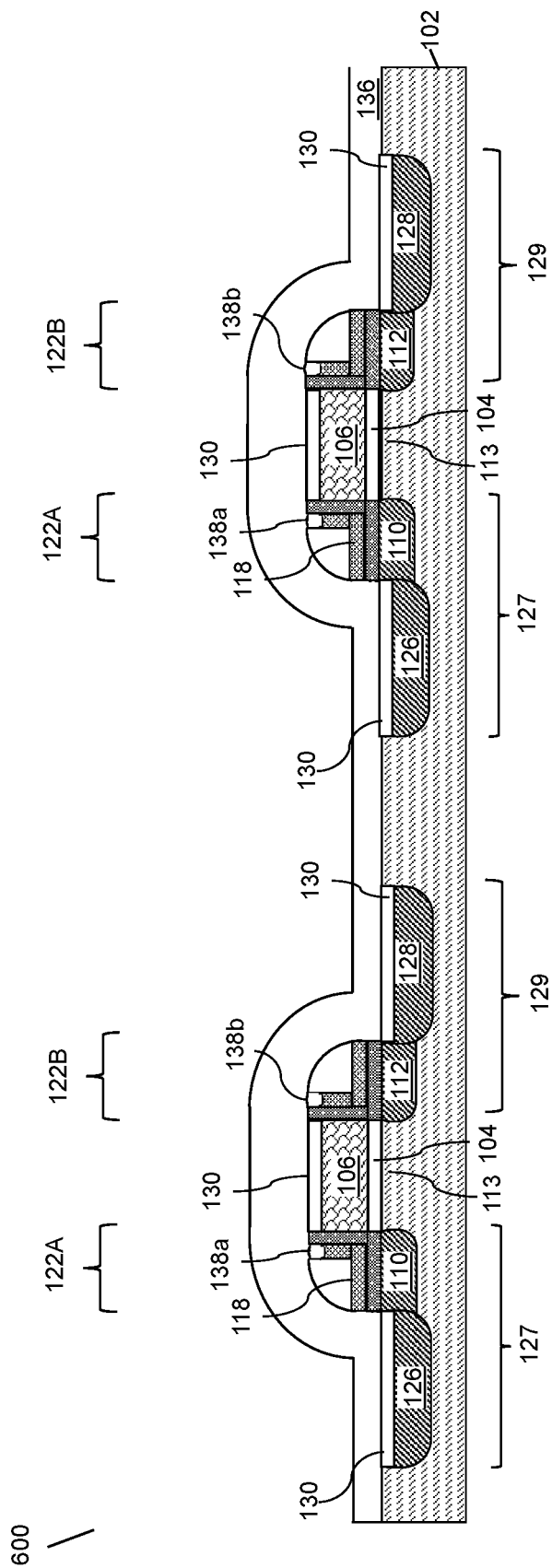
FIG. 19 is a vertical cross-sectional view illustrating a step of forming air gaps in the first portion of the transistor structures in the sidewall spacers next to the gate and forming air gaps in the second portion of the transistor structures in a portion of the sidewall spacers over the source/drain regions in the other method for fabricating a semiconductor device in accordance with some embodiments.

Referring to FIG. 19, the photoresist layer 108 may be removed by any suitable method, such as ashing. Next, a contact etch stop layer 136 may be formed over the surface of the substrate 102, the first and second sidewall spacers 122A,122B and the patterned gate layers 106. As discussed above, the contact etch stop layer 136 may be made of any suitable material. The contact etch stop layer 136 may cover the tops of the first and third trenches 132a, 132b. In this manner, first and third air gaps 138a, 138b may be formed in the patterned nitride layer 118 of the first and second sidewall spacers 122A, 122B without forming second and fourth air gaps 140a, 140b over the source or drain extension regions 110, 112.

Figure 20:
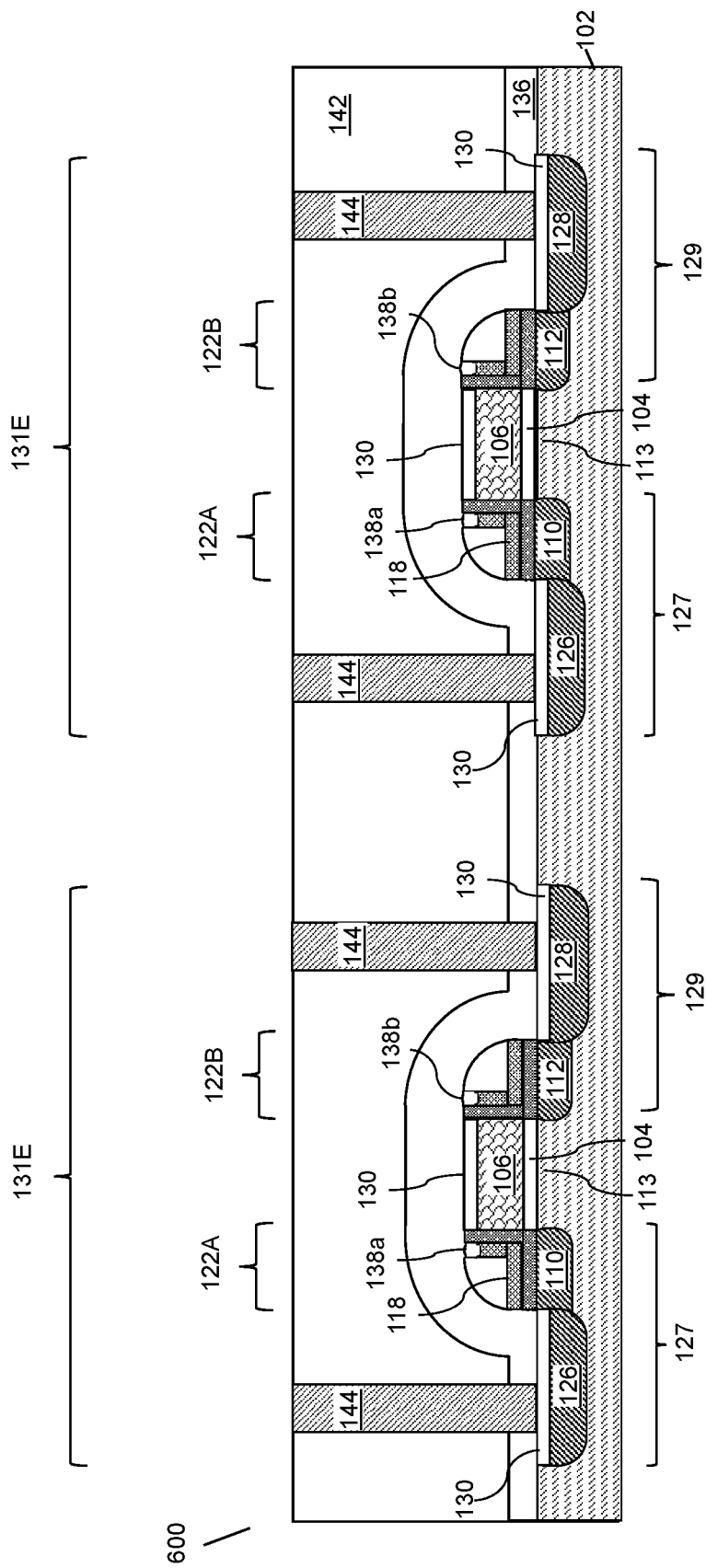
FIG. 20 is a vertical cross-sectional view illustrating a step of forming an interdielectric layer and source/drain electrodes in the other method for fabricating a semiconductor device in accordance with some embodiments.

Referring to FIG. 20, an interdielectric layer 142 may be deposited over the contact etch stop layer 136. Then, a photoresist layer (not shown) may be deposited and patterned top form via holes (not shown) in the interdielectric layer 142 and the contact etch stop layer 136 and filled with metal, such as W, Cu, Co, Mo, Ru, other elemental metals, or an alloy or a combination thereof. Other suitable materials are within the contemplated scope of disclosure. In this manner, contact vias 144 coupled to the source and drain regions 127, 129 may be formed to complete the integrated semiconductor device 600 that includes transistor structures 131E, which include air gaps 138*a* and 138*b* in the patterned nitride layer 118 of the first and second sidewall spacers 122A, 122B without forming second and fourth air gaps 140*a*, 140*b* over the source or drain extension regions 110, 112.

Figure 21:
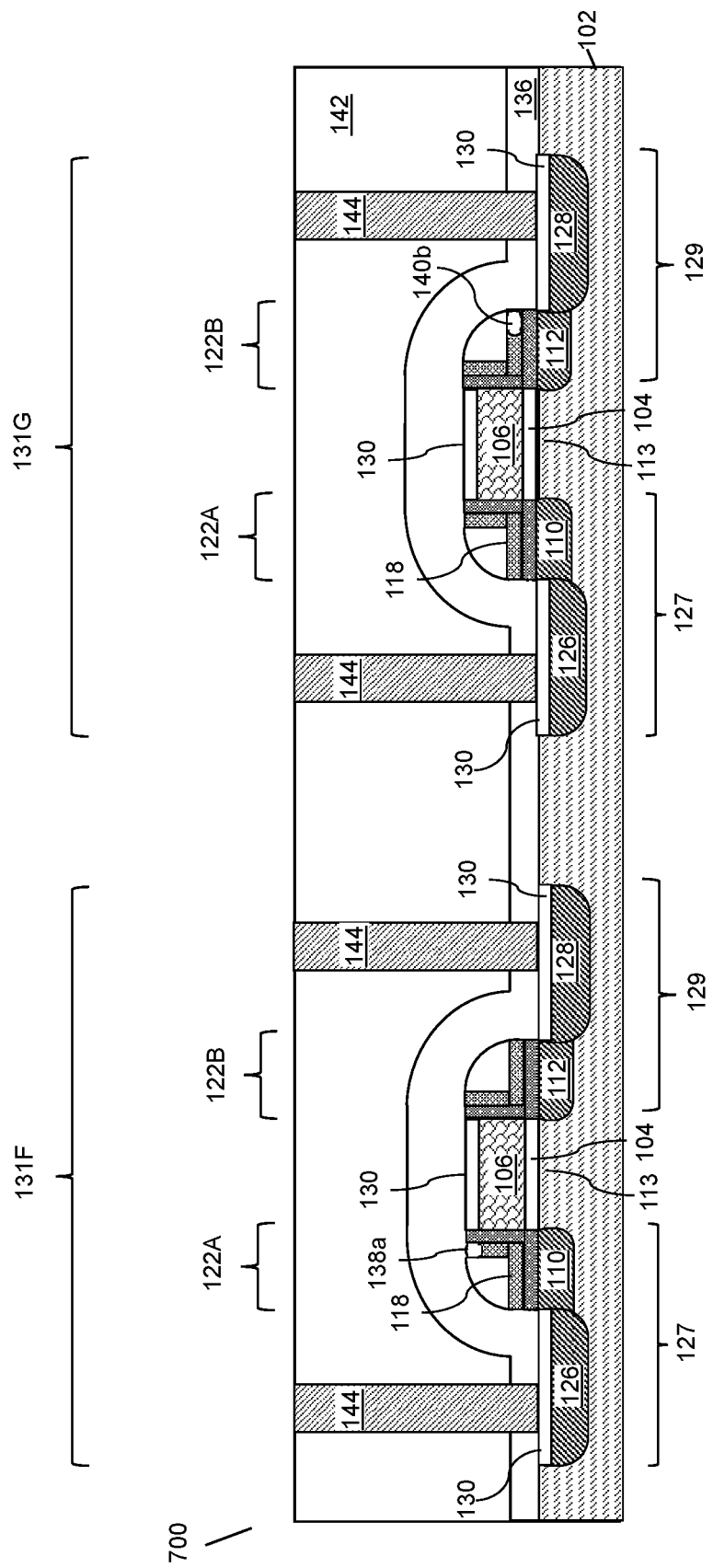
FIG. 21 is a vertical cross-sectional view illustrating a semiconductor device in which a first portion of transistor structures may have a single air gap in the nitride layer of the sidewalls adjacent the patterned gate dielectric layer and the patterned gate layer and a second portion of transistor structures may have a single air gap in the nitride layer of the sidewalls over the source or drain extension regions in accordance with some embodiments.

FIG. 21 illustrates another embodiment of an integrated semiconductor device 700 in which a first transistor structure 131F may have a single air gap 138*a* in the patterned nitride layer 118 in one of the first or second sidewall spacers 122A, 122B adjacent the patterned gate dielectric layer 104 and the patterned gate layer 106 and a second transistor structure 131G may have a single air gap 140*b* in the patterned nitride layer 118 of one of the first or second sidewall spacers 122A, 122B over the source or drain extension regions 110, 112 in accordance with some embodiments. In an alternative embodiment (not shown), all of the transistor structures may have a single air gap 138*a* in the patterned nitride layer 118 in one of the first or second sidewall spacers 122A, 122B adjacent the patterned gate dielectric layer 104 and the patterned gate layer 106. In still another embodiment (not shown), all of the transistor structures may have a single air gap 140*b* in the patterned nitride layer 118 of one of the first or second sidewall spacers 122A, 122B over the source or drain extension regions 110, 112.

Figure 22:
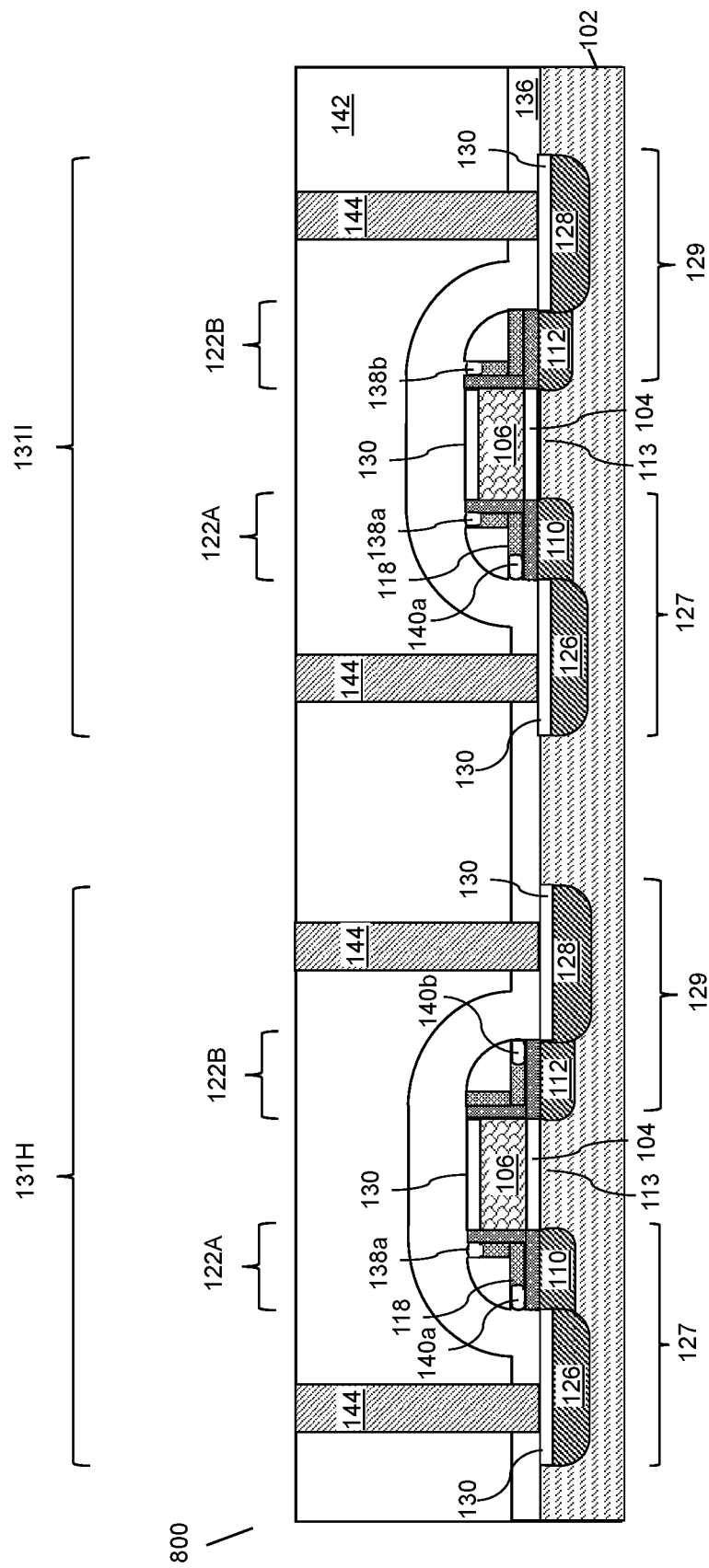
FIG. 22 is a vertical cross-sectional view illustrating a semiconductor device having a first portion of transistor structures with a single air gap in the nitride layer of the sidewalls adjacent the patterned gate dielectric layer and the patterned gate layer and air gaps in the nitride layer of the sidewalls over the source and drain extension regions and a second portion of transistor structures with a single air gap in the nitride layer of the sidewalls over the source or drain extension regions and air gaps in the nitride layer of the sidewalls adjacent the patterned gate dielectric layer and the patterned gate layer in accordance with some embodiments.

FIG. 22 illustrates another embodiment of an integrated semiconductor device 800. In this embodiment, a first transistor structure 131H may have a first sidewall spacer 122A with a pair of air gaps 138*a*, 140*a* and a second sidewall spacer 122B which only has a single sidewall spacer 140*b* over the source of drain extension regions 110, 112. A second transistor structure 131I may have a first sidewall spacer 122A with a pair of air gaps 138*a*, 140*a* and a second sidewall spacer 122B which only has a single sidewall spacer 138*b* adjacent the patterned gate dielectric layer 104 and the patterned gate layer 106. In an alternative embodiment (not shown), all of the transistor structures may include a pair of air gaps 138*a*, 140*a* or 138*b*, 140*b* in one of the first or second sidewall spacers 122A, 122B and one air gap 138*a*, 138*b*, 140*a*, 140*b* in the other of the first or second sidewall spacers 122A, 122B.

Figure 23:
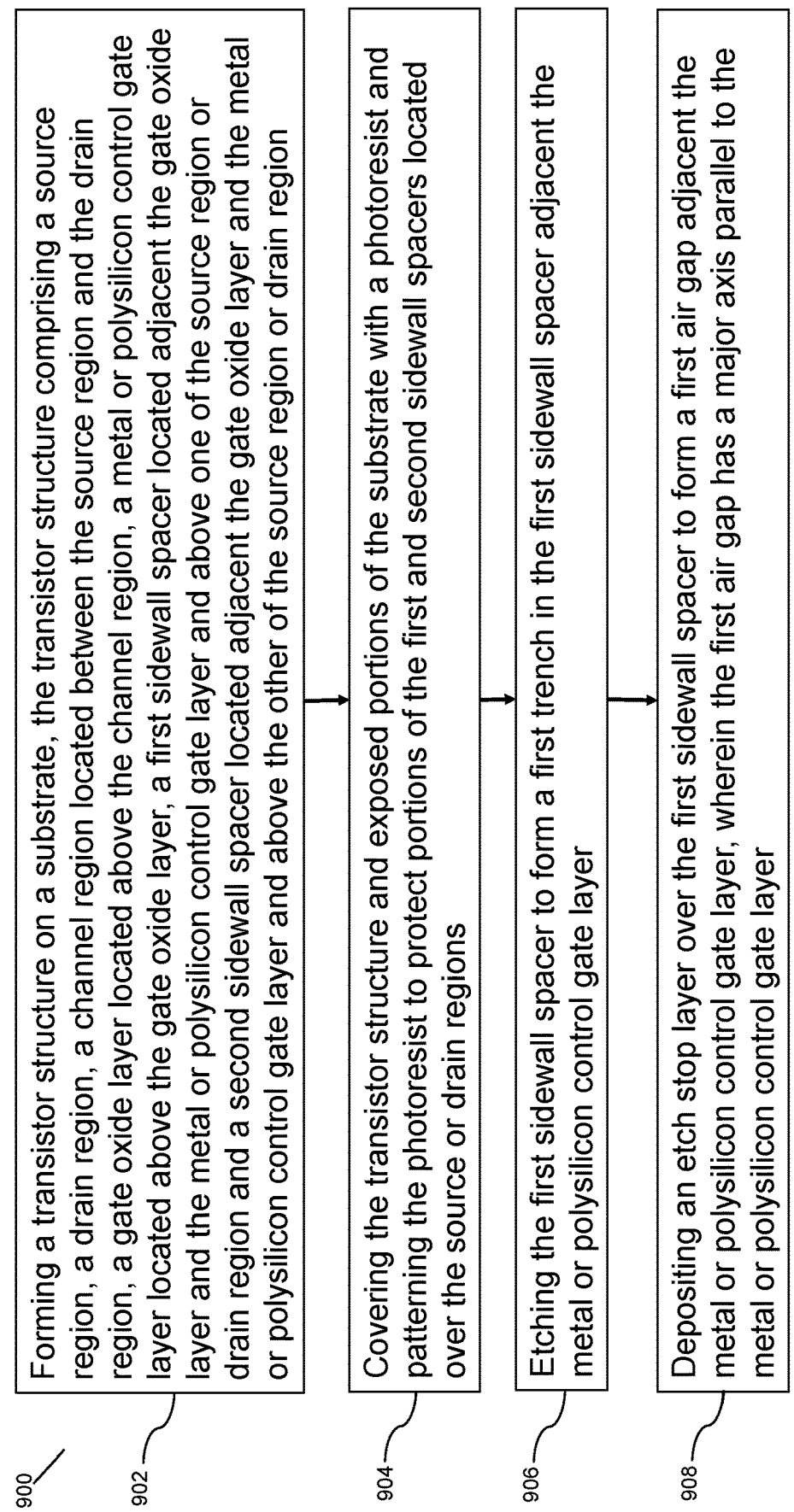
FIG. 23 is a flowchart illustrating another method of making a semiconductor device having air gaps in accordance with some embodiments.

Referring to FIG. 23, a flowchart illustrates a general method 900 of making a semiconductor device 600, 700, 800 in which a portion of the transistor structures lack at least one of the second or fourth air gaps 140*a*, 140*b* in accordance with some embodiments. Referring to step 902, a transistor structure 131 including a source region 127, a drain region 129, a channel region 113 located between the source region 127 and the drain region 129, a gate dielectric layer 104 located above the channel region 113, a metal or polysilicon gate layer 106 located above the gate dielectric layer 104, a first sidewall spacer 122A located adjacent the gate dielectric layer 104 and the metal or polysilicon gate layer 106 and above one of the source region 127 or drain region 129 and a second sidewall spacer 122B located adjacent the gate dielectric layer 104 and the metal or polysilicon gate layer 106 and above the other of the source region 127 or drain region 129 may be formed on a substrate 102.

Referring to step 904, the transistor structure 131 and exposed portions of the substrate 102 may be covered with a photoresist 108 to protect portions of the first and second sidewall spacers 122A, 122B located over the source or drain regions 127, 129.

Referring to step 906, the nitride layer 118 of first sidewall spacer 122A may be etched selective to the first and second oxide layers 116, 120 to form first trenches 132*a* in the first sidewall spacer 122A. The first trench 132*a* may be located adjacent the metal or polysilicon gate layer 106. The depth of the first trenches 132*a* may be controlled based on the etch time. That is, the longer the etching, the deeper the trenches that may be formed. Further, as discussed above, to make the embodiments illustrated in FIGS. 19-22 one or both sidewall spacers 122A, 122B of the transistor structures may be protected with a photoresist layer 108 while the exposed spacers are etched to make first, second, third, and fourth trenches 132*a*, 134*a*, 132*b*, 134*b*.

An embodiment is drawn to a metal oxide semiconductor field effect transistor (MOSFET) device 131 located on a substrate 102. The MOSFET device 131 includes drain/source regions 127, 129, a channel region 113 located between the source region and the drain region (127, 129), a gate dielectric layer 104 located above the channel region 113, a gate layer 106 located above the gate dielectric layer 104, a first sidewall spacer 122A located adjacent the gate dielectric layer 104 and the gate layer 106 and above the source region or drain region 127, 129, and a second sidewall spacer 122B located adjacent the gate dielectric layer 104 and the gate layer 106 and above the source region or drain region 127, 129. The MOSFET device 131 may include a first pair of air gaps 138*a*, 140*a* comprising a first air gap 138*a* and a second air gap 140*a*, located in the first sidewall spacer 122A, wherein the first air gap 138A is adjacent the gate layer 106 and the second air gap 140*a* is located over the source or drain region 127/129, wherein the first air gap 138*a* has major axis parallel to the gate layer 106 and the second air gap 140*a* has a major axis parallel to a major surface of the substrate 102.

An embodiment is drawn to an integrated circuit metal oxide semiconductor field effect transistor device 100, 200, 300 on a substrate 102 including a plurality of metal oxide semiconductor field effect transistors 131, wherein at least a portion of the plurality of metal oxide semiconductor field effect transistors comprise first and second sidewall spacers 122A, 122B comprising first, second, third, and fourth air gaps 138*a*, 140*a*, 138*b*, 140*b*.

An embodiment is drawn to a method 400 of making a metal oxide semiconductor transistor on a substrate 102 including forming a transistor structure 131 comprising a source region 127, a drain region 129, a channel region 113 located between the source region 127 and the drain region 129, a gate dielectric layer 104 located above the channel region 113, a metal or polysilicon gate layer 106 located above the gate dielectric layer 104, a first sidewall spacer 122A located adjacent the gate dielectric layer 104 and the metal or polysilicon gate layer 106 and above one of the source region 127 or drain region 129 and a second sidewall spacer 122B located adjacent the gate dielectric layer 104 and the metal or polysilicon gate layer 106 and above the other of the source region 127 or drain region 129. The method also includes etching the first sidewall spacer 122A to form first and second trenches 132*a*, 134*a* in the first sidewall spacer 122A, first and second trenches 132*a*, 134*a* comprising a first trench 132*a* adjacent the metal or polysilicon gate layer 106 and a second trench 134*a* located over the source (or third trench 132*b* adjacent the metal or polysilicon gate layer 106 and a fourth trench 134*b* located over the drain region 129) and depositing an etch stop layer 136 over the first sidewall spacer 122A to form a first air gap 138*a* adjacent the metal or polysilicon gate layer 106 and a second air gap 140*a* located over the source region 127 (or third air gap 138*b* adjacent the metal or polysilicon gate layer 106 and a fourth air gap 140*b* located over the drain region 129), wherein the first air gap 138*a* has a major axis parallel to the metal or polysilicon gate layer 106 and the second air gap 140a has a major axis parallel to a major surface of the substrate 102.

Referring to another embodiment of the present disclosure, a metal oxide semiconductor field effect transistor (MOSFET) is provided that may include: a substrate 102 comprising a source region 127 and drain region 129; a channel region 113 between the source region 127 and drain region 129; a gate dielectric layer 104 on a surface of the substrate 102 and over the channel region 113; a gate 106 on the gate dielectric layer 104; and a first sidewall spacer 122A on a first sidewall of the gate 106, the first sidewall spacer 122A may include: a first oxide layer 116 including a first portion extending along the first sidewall of the gate 106 and a second portion extending along the surface of the substrate 102; and a nitride layer 118 on the first oxide layer 116, and including a first air gap 138a having an end that is substantially aligned with an end of the first portion of the first oxide layer 116, and a second air gap 140a having an end that is substantially aligned with an end of the second portion of the first oxide layer 116.

In one embodiment, the metal oxide semiconductor field effect transistor (MOSFET) may also include an etch stop layer 136 on the first sidewall spacer 122A and defining the end of the first air gap 138a and the end of the second air gap 140a. In one embodiment, the etch stop layer 136 contacts the end of the first portion of the first oxide layer 116 and the end of the second portion of the first oxide layer 116. In one embodiment, the first portion of the first oxide layer 116 contacts the first sidewall of the gate 106, and the second portion of the first oxide layer 116 contacts the surface of the substrate 102. In one embodiment, the first air gap 138a has a major axis parallel to the first sidewall of the gate 106, and the second air gap 140a has a major axis parallel to the surface of the substrate 102. In one embodiment, the source region 127 or drain region 129 may include a covered portion that is covered by the first sidewall spacer 122A and an uncovered portion that is not covered by the first sidewall spacer 122A. In one embodiment, the source region 127 comprises a source extension region and the drain region 129 comprises a drain extension region, and the end of the second air gap 140a is substantially aligned with an end of the source extension region or an end of the drain extension region. In one embodiment, the source region 127 further comprises a deep source region and the drain region 129 further comprises a deep drain region, and the uncovered portion of the source region 127 or drain region 129 comprises the deep source region or the deep drain region. In one embodiment, the MOSFET may also include a second oxide layer 120 on the nitride layer 118 and having an arc-shaped surface having a first end located at the end of the first air gap 122A, and a second end located at the end of the second air gap 140a. In one embodiment, the first oxide layer 116 may include a first material and the second oxide layer 120 may include a second material different than the first material. In one embodiment, the MOSFET device may also include: a second sidewall spacer 122B on a second sidewall of the gate 106 opposite the first sidewall of the gate 106, that may include: a first oxide layer 116 including a first portion extending along the second sidewall of the gate 106 and a second portion extending along the surface of the substrate 102; and a nitride layer 118 on the first oxide layer 116 of the second sidewall spacer 122B, and including a third air gap 138b having an end that is substantially aligned with an end of the first portion of the first oxide layer 116 of the second sidewall spacer 122B, and a fourth air gap 140b that is substantially aligned with an end of the second portion of the first oxide layer 116 of the second sidewall spacer 122B. In one embodiment, the first air gap 138a and second air gap 140a have a first size and the third air gap 138b and fourth air gap 140b have a second size different than the first size. In one embodiment, a height of the first air gap 138a is between 0.001 times a combined height of the gate 106 and the gate dielectric layer 104 and 0.7 times a combined height of the gate 106 and the gate dielectric layer 104. In one embodiment, a height of the second air gap 140a is in a range from 20 Å to 250 Å.

Referring to another embodiment of the present disclosure, a semiconductor device is provided that may include: a first metal oxide semiconductor field effect transistor (MOSFET) on a substrate that includes: a first gate; and a first pair of sidewall spacers on opposing sidewalls of the first gate, that include: a first oxide layer; and a nitride layer on the first oxide layer and including first air gaps having an end that is substantially aligned with an end of the first oxide layer; and a second MOSFET on the substrate adjacent to the first MOSFET, that includes: a second gate; and a second pair of sidewall spacers on opposing sidewalls of the second gate, comprising: a first oxide layer; and a nitride layer on the first oxide layer of the second pair of sidewall spacers and including second air gaps having an end that is substantially aligned with an end of the first oxide layer of the second pair of sidewall spacers.

In one embodiment, the semiconductor device may also include an etch stop layer on the first pair of sidewall spacers and second pair of sidewall spacers and defining the end of the first air gaps and the end of the second air gaps. In one embodiment, the first pair of sidewall spacers comprises a first sidewall spacer and second sidewall spacer and the first air gaps are located in the first sidewall spacer and the second sidewall spacer, and the second pair of sidewall spacers comprises a third sidewall spacer and fourth sidewall spacer and the second air gaps are located in the third sidewall spacer and the fourth sidewall spacer. In one embodiment, the first pair of sidewall spacers comprises a first sidewall spacer and second sidewall spacer, and the first air gaps are located in the first sidewall spacer and not located in the second sidewall spacer, and the second pair of sidewall spacers comprises a third sidewall spacer and fourth sidewall spacer, and the second air gaps are located in the third sidewall spacer and not located in the fourth sidewall spacer. In one embodiment, the first pair of sidewall spacers comprises a first sidewall spacer and second sidewall spacer, and the first air gaps are located in the first sidewall spacer and the second sidewall spacer, and the second pair of sidewall spacers comprises a third sidewall spacer and fourth sidewall spacer, and the second air gaps are located in the third sidewall spacer and not located in the fourth sidewall spacer.

Referring to another embodiment method of making a metal oxide semiconductor field effect transistor (MOSFET) of the present disclosure, the method may include: forming a gate 106 on a substrate 102; forming a source region 127 and a drain region 129 in the substrate on opposing sides of the gate 106; forming a sidewall spacer 122A, 122B on a sidewall of the gate 106, the sidewall spacer 122A, 122B comprising a first oxide layer 116 contacting the sidewall of the gate 106, a nitride layer 118 on the first oxide layer 116 and a second oxide layer 120 on the nitride layer 118; and etching the nitride layer 118 to form a first air gap 138a having an end that is substantially aligned with a first end of the first oxide layer 116 and a first end of the second oxide layer 120, and a second air gap 140a having an end that is substantially aligned with a second end of the first oxide layer 116 and a second end of the second oxide layer 120.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal oxide semiconductor field effect transistor (MOSFET), comprising:
    a substrate comprising a source region and drain region;
    a channel region between the source region and drain region;
    a gate dielectric layer on a surface of the substrate and over the channel region;
    a gate on the gate dielectric layer;
    a first sidewall spacer on a first sidewall of the gate, comprising:
        a first oxide layer including a first portion extending along the first sidewall of the gate and a second portion extending along the surface of the substrate; and
        a nitride layer on the first oxide layer, and including a first air gap having an end that is substantially aligned with an end of the first portion of the first oxide layer, and a second air gap having an end that is substantially aligned with an end of the second portion of the first oxide layer; and
    an etch stop layer on the first sidewall spacer, wherein the etch stop layer defines the end of the first air gap and the end of the second air gap.

2. The MOSFET of claim 1, wherein the etch stop layer contacts the end of the first portion of the first oxide layer and the end of the second portion of the first oxide layer.

3. The MOSFET of claim 1, wherein the first portion of the first oxide layer contacts the first sidewall of the gate, and the second portion of the first oxide layer contacts the surface of the substrate.

4. The MOSFET of claim 1, wherein the first air gap has a major axis parallel to the first sidewall of the gate, and the second air gap has a major axis parallel to the surface of the substrate.

5. The MOSFET of claim 1, wherein the source region or drain region comprises a covered portion that is covered by the first sidewall spacer and an uncovered portion that is not covered by the first sidewall spacer.

6. The MOSFET of claim 5, wherein the source region comprises a source extension region and the drain region comprises a drain extension region, and the end of the second air gap is substantially aligned with an end of the source extension region or an end of the drain extension region.

7. The MOSFET of claim 6, wherein the source region further comprises a deep source region and the drain region further comprises a deep drain region, and the uncovered portion of the source region or drain region comprises the deep source region or the deep drain region.

8. The MOSFET of claim 1, further comprising:
    a second oxide layer on the nitride layer and having an arc-shaped surface having a first end located at the end of the first air gap, and a second end located at the end of the second air gap.

9. The MOSFET of claim 8, wherein the first oxide layer comprises a first material and the second oxide layer comprises a second material different than the first material.

10. The MOSFET of claim 1, further comprising:
    a second sidewall spacer on a second sidewall of the gate opposite the first sidewall of the gate, comprising:
        a first oxide layer including a first portion extending along the second sidewall of the gate and a second portion extending along the surface of the substrate; and
        a nitride layer on the first oxide layer of the second sidewall spacer, and including a third air gap having an end that is substantially aligned with an end of the first portion of the first oxide layer of the second sidewall spacer, and a fourth air gap that is substantially aligned with an end of the second portion of the first oxide layer of the second sidewall spacer.

11. The MOSFET of claim 10, wherein the first air gap and second air gap have a first size and the third air gap and fourth air gap have a second size different than the first size.

12. The MOSFET of claim 1, wherein a height of the first air gap is between 0.001 times a combined height of the gate and the gate dielectric layer and 0.7 times a combined height of the gate and the gate dielectric layer.

13. The MOSFET of claim 1, wherein a height of the second air gap is in a range from 20 Å to 250 Å.

14. The MOSFET of claim 1, further comprising:
    a silicide layer on the gate, wherein a bottom surface of the etch stop layer contacts the silicide layer over the gate.

15. A semiconductor device, comprising:
    a first metal oxide semiconductor field effect transistor (MOSFET) on a substrate, comprising:
        a first gate; and
        a first pair of sidewall spacers on opposing sidewalls of the first gate, comprising:
            a first oxide layer; and
            a nitride layer on the first oxide layer and including first air gaps having an end that is substantially aligned with an end of the first oxide layer;
    a second MOSFET on the substrate adjacent to the first MOSFET, comprising:
        a second gate; and
        a second pair of sidewall spacers on opposing sidewalls of the second gate, comprising:
            a first oxide layer; and
            a nitride layer on the first oxide layer of the second pair of sidewall spacers and including second air gaps having an end that is substantially aligned with an end of the first oxide layer of the second pair of sidewall spacers; and
    an etch stop layer on the first pair of sidewall spacers and second pair of sidewall spacers, wherein the etch stop layer defines the end of the first air gaps and the end of the second air gaps.

16. The semiconductor device of claim 15, wherein the first pair of sidewall spacers comprises a first sidewall spacer and second sidewall spacer and the first air gaps are located in the first sidewall spacer and the second sidewall spacer, and the second pair of sidewall spacers comprises a third sidewall spacer and fourth sidewall spacer and the second air gaps are located in the third sidewall spacer and the fourth sidewall spacer.

17. The semiconductor device of claim 15, wherein the first pair of sidewall spacers comprises a first sidewall spacer and second sidewall spacer, and the first air gaps are located in the first sidewall spacer and not located in the second sidewall spacer, and the second pair of sidewall spacers comprises a third sidewall spacer and fourth sidewall spacer, and the second air gaps are located in the third sidewall spacer and not located in the fourth sidewall spacer.

18. The semiconductor device of claim 15, wherein the first pair of sidewall spacers comprises a first sidewall spacer and second sidewall spacer, and the first air gaps are located in the first sidewall spacer and the second sidewall spacer, and the second pair of sidewall spacers comprises a third sidewall spacer and fourth sidewall spacer, and the second air gaps are located in the third sidewall spacer and not located in the fourth sidewall spacer.

19. A method of making a metal oxide semiconductor field effect transistor (MOSFET), the method comprising:
   forming a gate on a substrate;
   forming a source region and a drain region in the substrate on opposing sides of the gate;
   forming a sidewall spacer on a sidewall of the gate, the sidewall spacer comprising a first oxide layer contacting the sidewall of the gate, a nitride layer on the first oxide layer and a second oxide layer on the nitride layer;
   etching the nitride layer to form a first air gap having an end that is substantially aligned with a first end of the first oxide layer and a first end of the second oxide layer, and a second air gap having an end that is substantially aligned with a second end of the first oxide layer and a second end of the second oxide layer; and
   forming an etch stop layer on the sidewall spacer, wherein the etch stop layer defines the end of the first air gap and the end of the second air gap.

20. The MOSFET of claim 14, wherein the silicide layer is on the source region and the drain region, and the bottom surface of the etch stop layer contacts the silicide layer over the source region and over the drain region.

\* \* \* \* \*